US012002825B2

United States Patent
Fukui et al.

(10) Patent No.: US 12,002,825 B2
(45) Date of Patent: Jun. 4, 2024

(54) SOLID-STATE IMAGING DEVICE AND ELECTRONIC APPARATUS WITH IMPROVED SENSITIVITY

(71) Applicant: SONY SEMICONDUCTOR SOLUTIONS CORPORATION, Kanagawa (JP)

(72) Inventors: Ryo Fukui, Kanagawa (JP); Takashi Machida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 688 days.

(21) Appl. No.: 17/263,221

(22) PCT Filed: Jul. 26, 2019

(86) PCT No.: PCT/JP2019/029429
§ 371 (c)(1),
(2) Date: Jan. 26, 2021

(87) PCT Pub. No.: WO2020/036054
PCT Pub. Date: Feb. 20, 2020

(65) Prior Publication Data
US 2021/0296378 A1   Sep. 23, 2021

(30) Foreign Application Priority Data
Aug. 15, 2018 (JP) .................................. 2018-152938

(51) Int. Cl.
*H01L 27/146* (2006.01)
(52) U.S. Cl.
CPC .... *H01L 27/1461* (2013.01); *H01L 27/14621* (2013.01); *H01L 27/14623* (2013.01);
(Continued)

(58) Field of Classification Search
CPC ........... H01L 27/1461; H01L 27/14621; H01L 27/14623; H01L 27/14627; H01L 27/1463;
(Continued)

(56) References Cited

U.S. PATENT DOCUMENTS

| 2012/0241895 A1* | 9/2012 | Kurogi ................ H01L 27/1462 257/431 |
| 2013/0037900 A1* | 2/2013 | Abe ................... H01L 27/14638 438/57 |

(Continued)

FOREIGN PATENT DOCUMENTS

| JP | 2013-098446 | 5/2013 |
| JP | 2016-534557 | 11/2016 |

(Continued)

OTHER PUBLICATIONS

International Search Report prepared by the Japan Patent Office dated Sep. 27, 2019, for International Application No. PCT/JP2019/029429.

*Primary Examiner* — Caleb E Henry
(74) *Attorney, Agent, or Firm* — Sheridan Ross PC

(57) ABSTRACT

A solid-state imaging device of an embodiment of the present disclosure includes a semiconductor substrate having one surface and another surface opposed to the one surface, a photoelectric conversion section formed to be embedded in the semiconductor substrate, a charge holding section provided in the one surface of the semiconductor substrate while being stacked on the photoelectric conversion section, an n-type semiconductor region provided in the one surface of the semiconductor substrate, and a charge-voltage conversion section provided in the one surface of the semiconductor substrate. A charge generated in the photo- (Continued)

electric conversion section is transferred via the n-type semiconductor region to the charge holding section.

11 Claims, 26 Drawing Sheets

(52) U.S. Cl.
CPC .... *H01L 27/14627* (2013.01); *H01L 27/1463* (2013.01); *H01L 27/14645* (2013.01)

(58) Field of Classification Search
CPC ... H01L 27/14645; H04N 25/70; H04N 25/77
See application file for complete search history.

(56) References Cited

U.S. PATENT DOCUMENTS

| | | | |
|---|---|---|---|
| 2014/0117429 A1* | 5/2014 | Nomoto | H01L 27/14612 |
| | | | 257/292 |
| 2015/0035028 A1* | 2/2015 | Fan | H01L 27/14638 |
| | | | 257/292 |
| 2016/0343756 A1 | 11/2016 | Fan et al. | |
| 2018/0033809 A1* | 2/2018 | Tayanaka | H01L 27/0248 |
| 2018/0220092 A1* | 8/2018 | Takaya | H04N 25/62 |
| 2020/0035722 A1* | 1/2020 | Toyoguchi | G06T 7/55 |
| 2021/0296378 A1* | 9/2021 | Fukui | H01L 27/14627 |
| 2021/0400225 A1* | 12/2021 | Manda | H01L 27/14614 |
| 2022/0320156 A1* | 10/2022 | Kawamura | H01L 27/14605 |

FOREIGN PATENT DOCUMENTS

| | | |
|---|---|---|
| JP | 2017-076899 | 4/2017 |
| WO | WO 2016/136486 | 9/2016 |

\* cited by examiner

SOLID-STATE IMAGING DEVICE AND ELECTRONIC APPARATUS WITH IMPROVED SENSITIVITY

CROSS REFERENCE TO RELATED APPLICATIONS

This application is a national stage application under 35 U.S.C. 371 and claims the benefit of PCT Application No. PCT/JP2019/029429 having an international filing date of 26 Jul. 2019, which designated the United States, which PCT application claimed the benefit of Japanese Patent Application No. 2018-152938, filed 15 Aug. 2018, the entire disclosures of each of which are incorporated herein by reference.

TECHNICAL FIELD

The present disclosure relates to, for example, a solid-state imaging device in which a photodiode and a memory are stacked, and an electronic apparatus including the solid-state imaging device.

In a global-shutter type CMOS (Complementary Metal Oxide Semiconductor) image sensor (CIS), a memory section (MEM) that temporarily accumulates optical charges transferred from a photodiode (PD) is provided aside from a floating diffusion layer, and this enables distortion-free shooting even if a subject is moving. In a typical global-shutter type CIS, the photodiode (PD) and the memory section (MEM) are provided on the same plane of a substrate. Accordingly, an area for providing the photodiode (PD) and the memory section (MEM) is limited, which makes it difficult to improve a saturation signal amount, thus making it difficult to improve sensitivity.

To cope with this, for example, PTL 1 discloses a solid-state imaging device in which the photodiode (PD) and the memory section (MEM) are provided in different layers in a semiconductor substrate and they are stacked to thereby increase respective areas for the photodiode (PD) and the memory section (MEM) to achieve improved sensitivity.

CITATION LIST

Patent Literature

PTL 1: Japanese Unexamined Patent Application Publication No. 2015-95468

SUMMARY OF THE INVENTION

Meanwhile, it is demanded that the CIS in which the photodiode (PD) and the memory section (MEM) are stacked as described above be further improved in sensitivity.

It is desirable to provide a solid-state imaging device and an electronic apparatus that are able to provide improved sensitivity.

A first solid-state imaging device of an embodiment of the present disclosure includes: a semiconductor substrate having one surface and another surface opposed to the one surface; a photoelectric conversion section formed to be embedded in the semiconductor substrate; a charge holding section provided in the one surface of the semiconductor substrate while being stacked on the photoelectric conversion section; an n-type semiconductor region provided in the one surface of the semiconductor substrate; and a charge-voltage conversion section provided in the one surface of the semiconductor substrate. A charge generated in the photoelectric conversion section is transferred via the n-type semiconductor region to the charge holding section.

A first electronic apparatus of an embodiment of the present disclosure includes the first solid-state imaging device according to the foregoing embodiment of the present disclosure.

A second solid-state imaging device of an embodiment of the present disclosure includes: a semiconductor substrate having one surface and another surface opposed to the one surface; a photoelectric conversion section formed to be embedded in the semiconductor substrate; a charge holding section provided in the one surface of the semiconductor substrate while being stacked on the photoelectric conversion section; an n-type semiconductor region provided in the one surface of the semiconductor substrate; a charge-voltage conversion section provided in the one surface of the semiconductor substrate; and a first separation film provided between the photoelectric conversion section and the charge holding section. The first separation film overlaps, in a plan view, at least a portion of a gate of a transfer transistor provided between the photoelectric conversion section and the charge holding section.

A second electronic apparatus of an embodiment of the present disclosure includes the second solid-state imaging device according to the foregoing embodiment of the present disclosure.

In the first solid-state imaging device of the embodiment, the first electronic apparatus of the embodiment, the second solid-state imaging device of the embodiment, and the second electronic apparatus of the embodiment of the present disclosure, the charge holding section, which is stacked on the photoelectric conversion section formed to be embedded in the semiconductor substrate, and the n-type semiconductor region are provided in the one surface of the semiconductor substrate. Charges generated in the photoelectric conversion section are transferred via the n-type semiconductor region to the charge holding section. This reduces direct movement of the charges from the photoelectric conversion section to the charge holding section, and thereby improves the saturation signal amounts of the photoelectric conversion section and the charge holding section.

According to the first solid-state imaging device of the embodiment, the first electronic apparatus of the embodiment, the second solid-state imaging device of the embodiment, and the second electronic apparatus of the embodiment of the present disclosure, the n-type semiconductor region is provided in the one surface of the semiconductor substrate in which the charge accumulation section is formed, and charges generated in the photoelectric conversion section are transferred via the n-type semiconductor region to the charge holding section. This reduces direct movement of the charges from the photoelectric conversion section to the charge holding section, thus making it possible to improve the saturation signal amounts of the photoelectric conversion section and the charge holding section. Accordingly, it is possible to provide a solid-state imaging device having high sensitivity and an electronic apparatus including the solid-state imaging device.

It is to be noted that the effects described here are not necessarily limitative, and may be any of the effects described in the present disclosure.

MODES FOR CARRYING OUT THE INVENTION

Figure 1:
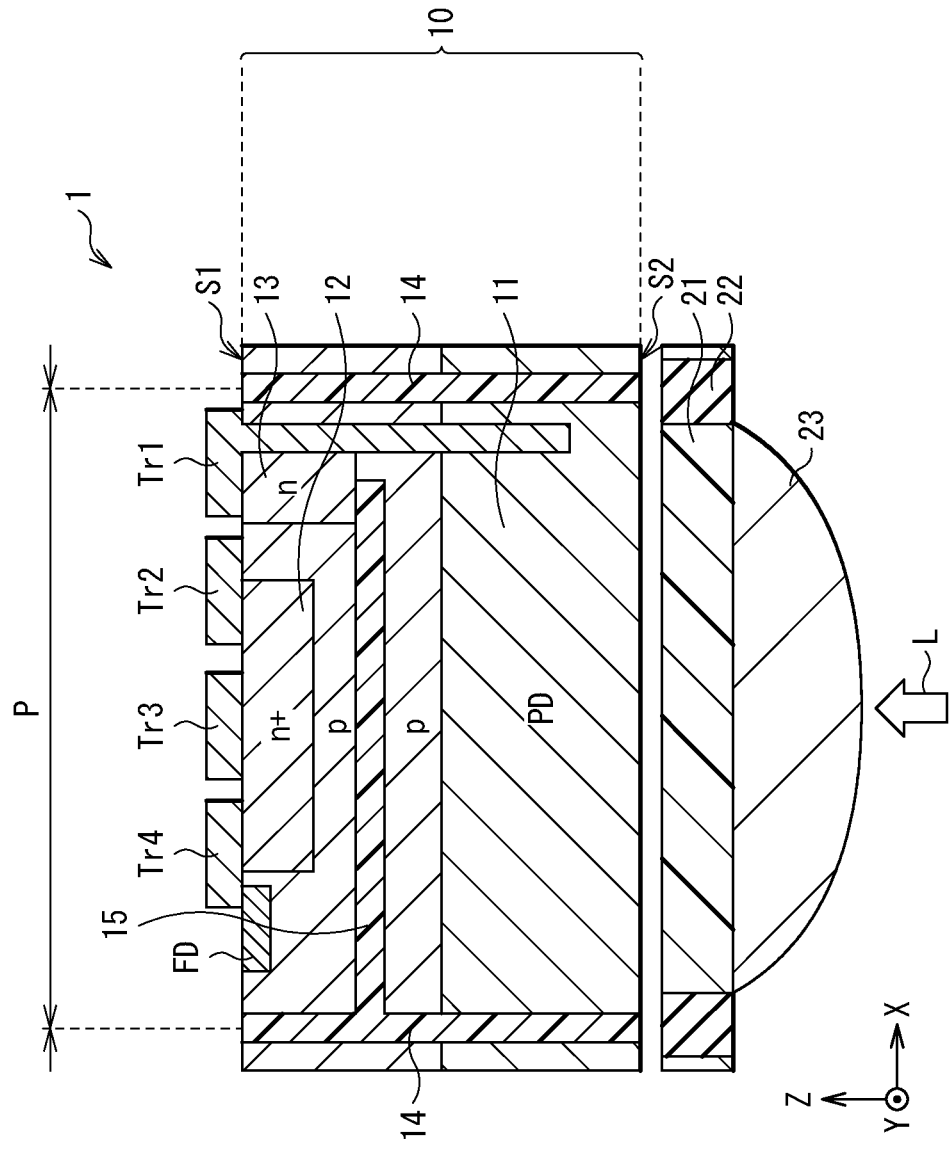
FIG. 1 is a schematic cross-sectional view in a Y-axis direction of a configuration of a solid-state imaging device according to a first embodiment of the present disclosure.

In the following, some embodiments of the present disclosure are described in detail with reference to the drawings. The following description is directed to specific examples of the present disclosure, and the present disclosure is not limited to the following embodiments. In addition, the present disclosure is not limited to the arrangement, dimensions, dimensional ratios, and the like of respective components illustrated in the drawings. It is to be noted that description is given in the following order.

1. First Embodiment
(An example in which a buffer region is provided between a PD and an MEM to transfer optical charges generated in the PD to the MEM via the buffer region)
   1-1. Configuration of Solid-State Imaging Device
   1-2. Method of Driving Solid-State Imaging Device
   1-3. Workings and Effects
2. Modification Example (An example in which a part or the whole of a separation film between the PD and the MEM is formed by the buffer region)

3. Second Embodiment (An example in which an OFG is directly coupled to the PD)
4. Third Embodiment (An example in which the OFG is directly coupled to each of the buffer region and the PD)
5. Application Example
6. Example of Practical Application
<1. First Embodiment>

Figure 2:
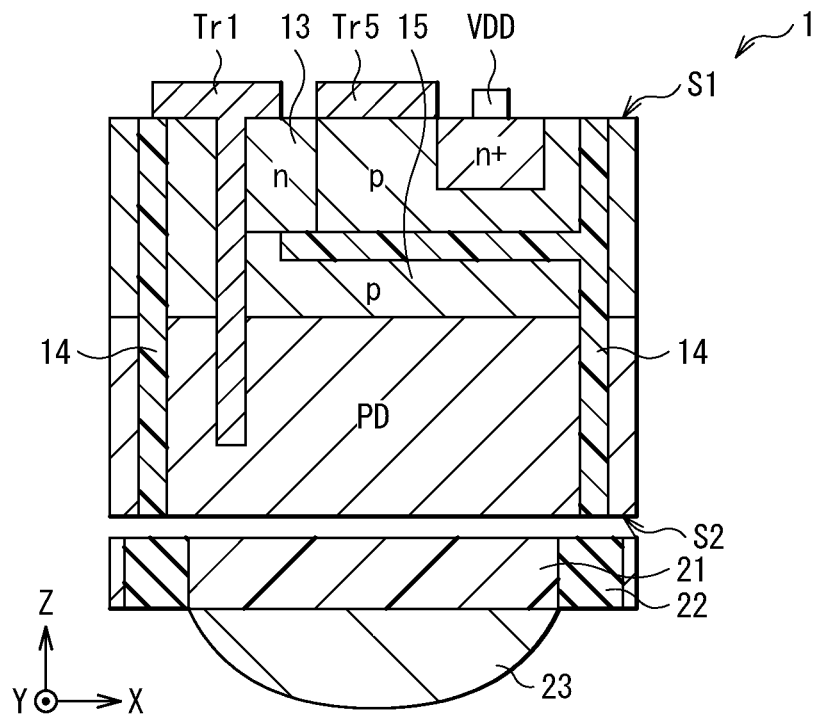
FIG. 2 is a schematic cross-sectional view in an X-axis direction of the configuration of the solid-state imaging device according to the first embodiment of the present disclosure.
Figure 3:
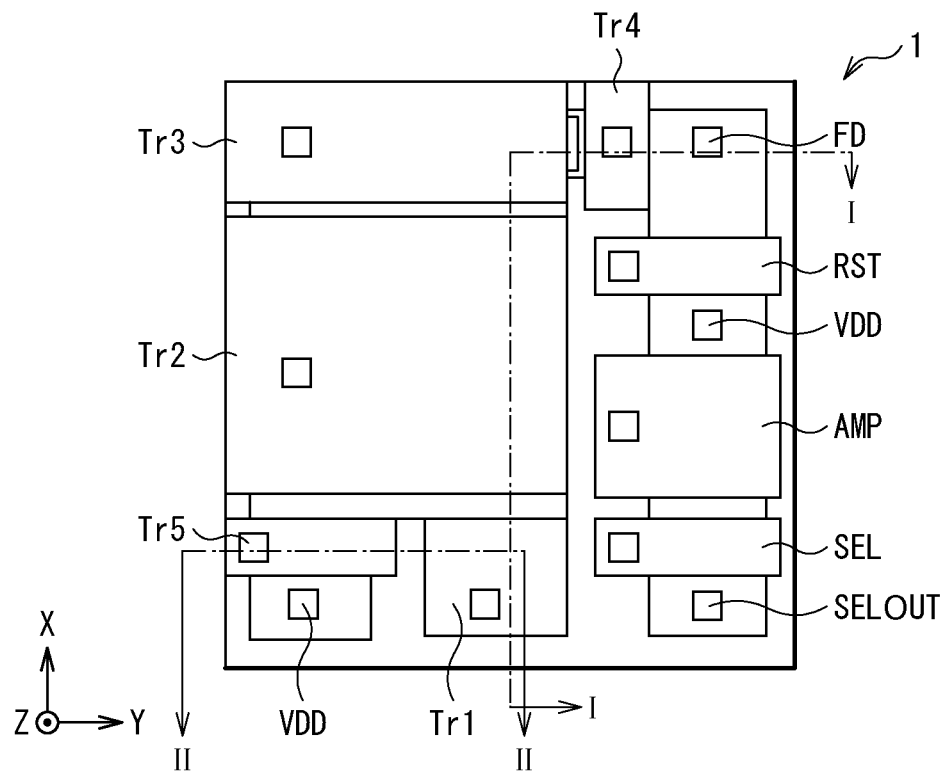
FIG. 3 is a schematic planar diagram illustrating a layout configuration of transistors of the solid-state imaging device illustrated in FIG. 1.
Figure 4:
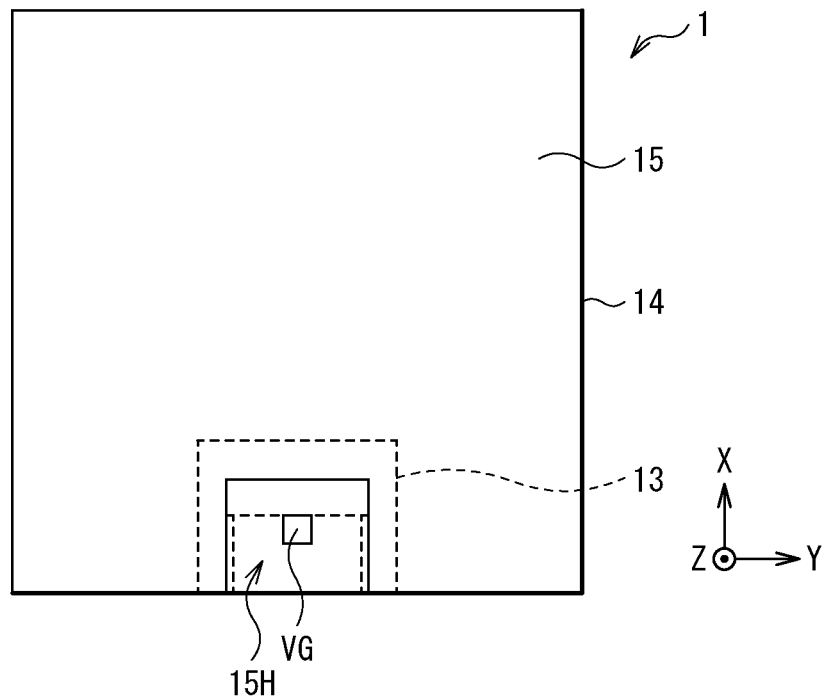
FIG. 4 is a schematic planar diagram illustrating an example of a configuration in another layer of the solid-state imaging device illustrated in FIG. 1.

FIG. 1 schematically illustrates a cross-sectional configuration in a Y-axis direction of a solid-state imaging device (solid-state imaging device 1) according to a first embodiment of the present disclosure. FIG. 2 schematically illustrates a cross-sectional configuration in an X-axis direction of the solid-state imaging device 1. FIG. 3 illustrates a layout configuration of transistors of the solid-state imaging device 1 in a plan view. FIG. 4 illustrates a planar configuration of the solid-state imaging device 1 in another layer. FIG. 1 illustrates a cross section along line I-I illustrated in FIG. 3. FIG. 2 illustrates a cross section along line II-II illustrated in FIG. 3. The solid-state imaging device 1 is a stacked back-illumination type solid-state imaging device having a global shutter function that configures, for example, a CMOS (Complementary Metal Oxide Semiconductor) image sensor or the like for use with an electronic apparatus such as a digital still camera or a video camera, and includes a photodiode (PD) and a memory section (MEM) that are stacked.

The solid-state imaging device 1 of the present embodiment includes a photoelectric conversion section 11 formed to be embedded in a semiconductor substrate 10, a memory section 12 (charge holding section) provided in a surface (surface S1; one surface) of the semiconductor substrate 10 on the photoelectric conversion section 11, a buffer region 13 (n-type semiconductor region) and a charge-voltage conversion section (floating diffusion FD) provided in the surface (surface 51) of the semiconductor substrate similarly to the memory section 12. A charge (signal charge) generated in the photoelectric conversion section 11 is transferred via the buffer region 13 to the memory section 12.

(1-1. Configuration of Solid-State Imaging Device)

In the solid-state imaging device 1, a photodiode (PD) serving as the photoelectric conversion section 11 is formed to be embedded in the semiconductor substrate 10, and the memory section 12, the buffer region 13, and the floating diffusion FD are provided in the surface (surface S1) of the semiconductor substrate 10. On the surface S1 of the semiconductor substrate 10, respective gates of transfer transistors Tr1, Tr2, Tr3, Tr4, and Tr5, a reset transistor RST, an amplifier transistor AMP, and a select transistor SEL are provided. On a back surface (surface S2) side of the semiconductor substrate 10, for example, a color filter 21, a light shield section 22, and an on-chip lens 23 are provided. The semiconductor substrate 10 is further provided with, for example, a pixel separation groove 14 (a second separation film) and a separation film 15 (a first separation film) between adjacent pixels P. The pixel separation groove 14 penetrates between the surface S1 and the surface S2 of the semiconductor substrate 10, and the separation film 15 is provided between the photoelectric conversion section 11 and the memory section 12.

It is to be noted that in the present embodiment, description is given of a case where electrons, out of pairs of electrons and holes (electron-hole pairs) generated by photoelectric conversion, are to be read as signal charges (a case where the n-type semiconductor region is used as a photoelectric conversion layer). In addition, in the drawings, "+ (plus)" attached to "p" or "n" indicates that a p-type or n-type impurity concentration is high.

Figure 25:
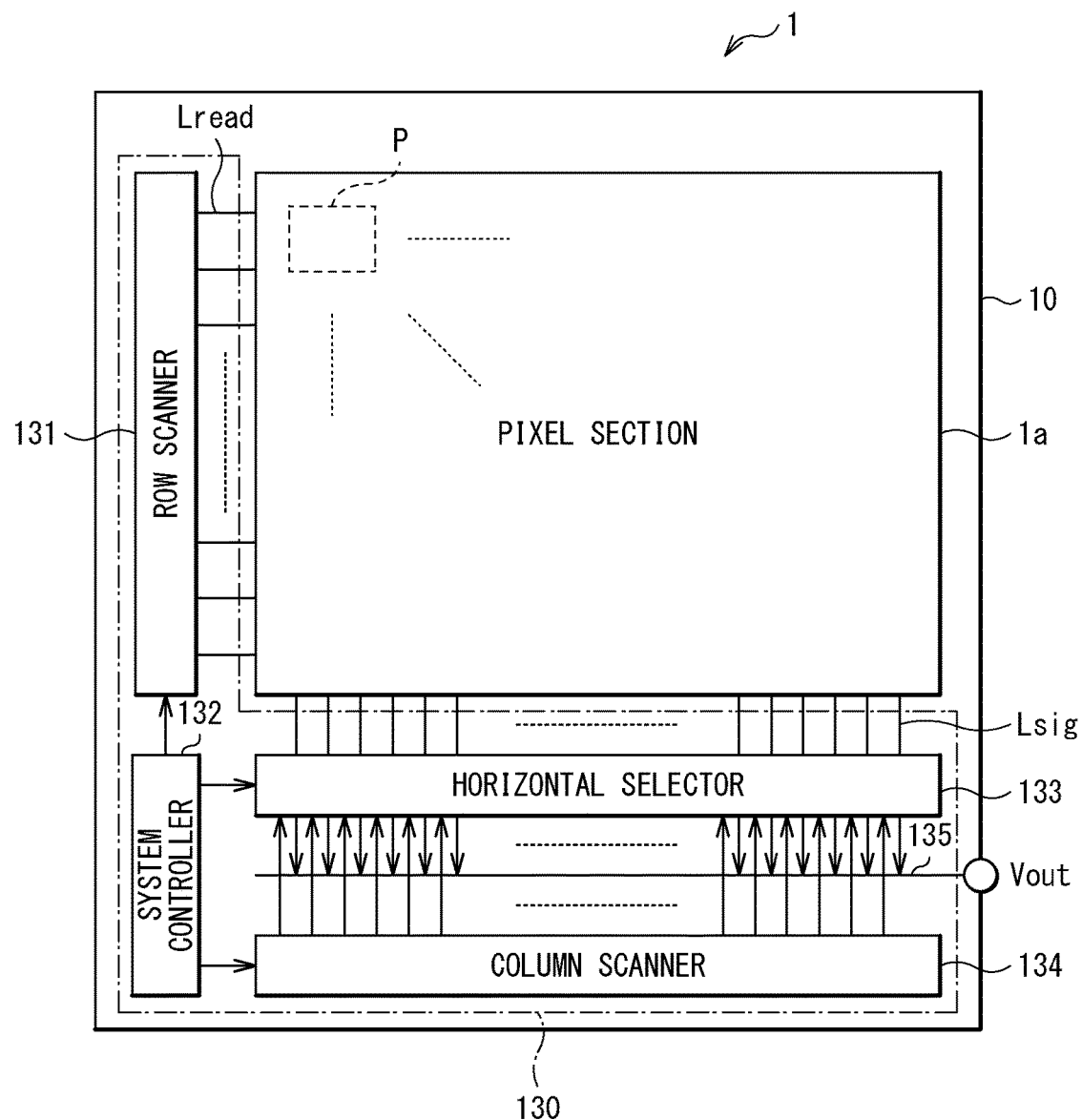
FIG. 25 is a block diagram illustrating an overall configuration of the imaging device illustrated in FIG. 1, etc.

The semiconductor substrate 10 is configured by, for example, an n-type silicon (Si) substrate, and has a p-well in a predetermined region (for example, a pixel section 1a; see FIG. 25).

The photoelectric conversion section 11 has a pn junction in a predetermined region of the semiconductor substrate 10. On the basis of light that has entered, the photoelectric conversion section 11 generates charges corresponding to the amount of the light that has entered by photoelectric conversion, and accumulates the generated charges.

The memory section 12 is formed by the n-type semiconductor region (n+ region), and a hole accumulation layer (not illustrated), for example, is provided on a surface of the n+ region. The signal charges generated in the photoelectric conversion section 11 are temporarily accumulated in the memory section 12.

The buffer region 13 serves to suppress leakage of charges (blooming) from the photoelectric conversion section 11 to the memory section 12. The buffer region 13 is formed by the n-type semiconductor region (n region). The buffer region 13 is provided on a transfer path through which the signal charges generated in the photoelectric conversion section 11 are transferred to the memory section 12, specifically, for example, below the transfer transistor Tr1, and has a lower end in contact with the separation film 15 to be described later. As a result, the signal charges generated in the photoelectric conversion section 11 are transferred via the buffer region 13 to the memory section 12.

The transfer transistor Tr1 is configured by, for example, a vertical transistor, operates on the basis of a transfer signal supplied at predetermined timing from a controller via a transfer signal line, and serves to transfer the signal charges accumulated in the photoelectric conversion section 11 to the buffer region 13 (neither of which is illustrated).

The transfer transistor Tr2 is provided between the buffer region 13 and the memory section 12, operates on the basis of a transfer signal supplied at predetermined timing from the controller via the transfer signal line, and serves to transfer the signal charges accumulated in the buffer region 13 to the memory section 12 by modulating a barrier between the buffer region 13 and the memory section 12.

The transfer transistor Tr3 is provided on the memory section 12, operates on the basis of a transfer signal supplied at predetermined timing from the controller via the transfer signal line, and serves to transfer the signal charges accumulated in the buffer region 13 to the memory section 12 by modulating and the memory section 12.

The transfer transistor Tr4 is provided between the memory section 12 and the floating diffusion FD, operates on the basis of a transfer signal supplied at predetermined timing from the controller via the transfer signal line, and serves to transfer the signal charges accumulated in the memory section 12 to the floating diffusion FD.

The transfer transistor Tr5 is provided between the buffer region 13 and a power supply VDD, operates on the basis of a transfer signal supplied at predetermined timing from the controller via the transfer signal line, and serves to discharge the signal charges accumulated in the photoelectric conversion section 11 by being driven simultaneously with the transfer transistor Tr1. It is to be noted that the transfer transistor Tr5 is also able to discharge the signal charges accumulated in the buffer region 13. At that time, the transfer transistor Tr5 is driven alone.

The reset transistor RST operates on the basis of a reset signal supplied at predetermined timing from the controller via a reset signal line, and discharges the charges accumulated in the floating diffusion FD.

The amplifier transistor AMP supplies to the select transistor SEL a voltage corresponding to the charges accumulated in the floating diffusion FD as a gate signal, and a voltage between a source and a drain as a pixel signal (light reception signal) by amplifying the voltage.

The select transistors SEL operates on the basis of a selection signal supplied at predetermined timing from the controller via a selection signal line, and outputs the pixel signal supplied from the amplifier transistor AMP to a vertical signal line.

It is to be noted that the transfer transistor Tr2 and the transfer transistor Tr3 may be provided as a single transfer transistor. Further, in the present embodiment, the gates of the reset transistor RST, the amplifier transistor AMP, and the select transistor SEL are assumed to be provided in a layer the same as that where the memory section 12 is provided; however, this is non-limiting.

The pixel separation groove 14 serves to optically and electrically separate adjacent pixels P from each other, and is provided between the surface S1 and the surface S2 of the semiconductor substrate 10. For example, a film of metal such as tungsten (W) is embedded in the pixel separation groove 14, and a film of oxide such as silicon oxide ($SiO_2$), hafnium oxide ($HfO_2$), zirconium oxide ($ZrO_2$), aluminum oxide ($Al_2O_3$), titanium oxide ($TiO_2$), or tantalum oxide ($Ta_2O_5$) is formed around the film of metal, that is, on a side surface of the pixel separation groove 14. As a result, obliquely entering light that can enter from an adjacent pixel P is blocked by the film of metal to achieve optical separation, and pixels P adjacent to each other are electrically insulated from each other by the film of oxide. It is to be noted that FIG. 1 illustrates an example in which the pixel separation groove 14 penetrates between the surface S1 and the surface S2 of the semiconductor substrate 10; however, this is non-limiting. It is sufficient that the pixel separation groove 14 has a depth enough to sufficiently block or absorb obliquely entering light that can enter from an adjacent pixel P.

The separation film 15 is provided between the photoelectric conversion section 11 and the memory section 12, and serves to separate the photoelectric conversion section 11 and the memory section 12 from each other electrically and optically. As with the pixel separation groove 14, for example, the separation film 15 includes a film of metal such as tungsten (W), for example, and a film of oxide such as silicon oxide ($SiO_2$), for example, is formed therearound. A film thickness in a Z-axis direction (hereinafter referred to as a unit thickness) of the separation film 15 is, for example, 100 nm or more and not more than 1 μm.

Figure 5:
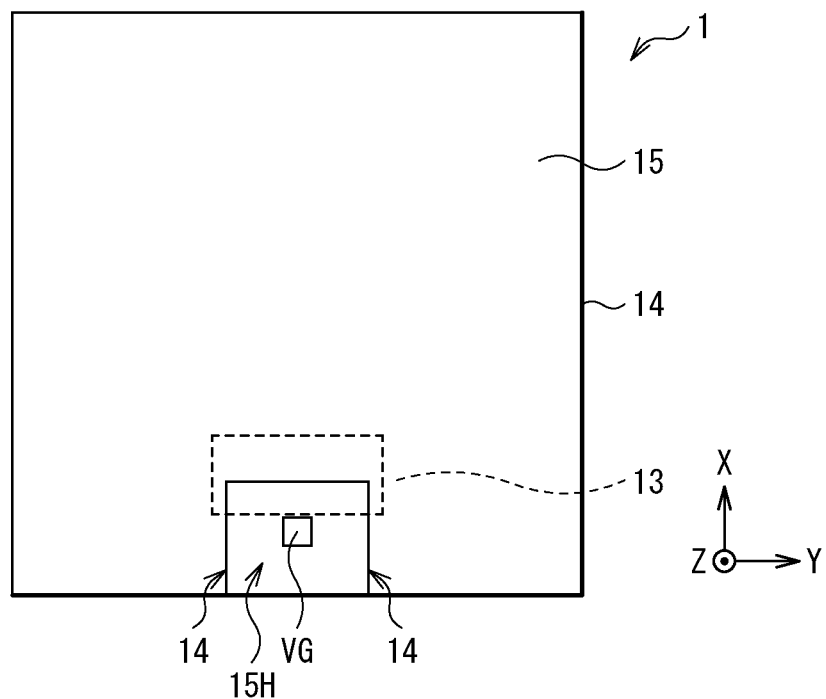
FIG. 5 is a schematic planar diagram illustrating another example of the configuration in the other layer of the solid-state imaging device illustrated in FIG. 1.

The separation film 15 is provided to extend over the entire surface of the pixel P between the photoelectric conversion section 11 and the memory section 12, for example. An end of a peripheral edge of the separation film 15 is in contact with the pixel separation groove 14 provided between adjacent pixels P, and an opening 15H is provided at a position where a VG of the transfer transistor Tr1, which is a vertical transistor, is formed, the VG being coupled to the photoelectric conversion section 11. The opening 15H is formed to have a peripheral edge overlapping the buffer region 13 in a plan view, as illustrated in FIG. 4. In other words, the separation film 15 is formed to overlap the gate of the transfer transistor Tr1 in a plan view. It is to be noted that as illustrated in FIG. 5, in a case where the overlap between the peripheral edge of the opening 15H and the buffer region 13 is limited to their respective portions, the pixel separation groove 14 is preferably formed to extend to a position overlapping the buffer region 13. This allows the signal charges generated in the photoelectric conversion section 11 to pass through the opening 15H of the separation film 15 and to be transferred via the buffer region 13 to the memory section 12.

The color filter 21 includes, for example, a red filter which transmits light in a red wavelength range, a green filter which transmits light in a green wavelength range, and a blue filter which transmits light in a blue wavelength range, and is provided in a regular color arrangement (for example, Bayer arrangement) within the pixel section 1a, for example. The light shield section 22, for example, is provided between adjacent pixels of the color filter 21 to achieve light shielding between pixels.

The on-chip lens 23 has light transmissivity, and serves to condense entering light L from the back surface (surface S2) side of the semiconductor substrate 10 toward the photoelectric conversion section 11. The on-chip lens 23 includes a high refractive index material, specifically, an inorganic material such as silicon oxide ($SiO_2$) or silicon nitride (SiN), for example. As another example, an organic material having a high refractive index such as an episulfide-based resin, a thietane compound or a resin thereof may be used. The shape of the on-chip lens 23 is not particularly limited, and various lens shapes including a hemispherical shape and a semicylindrical shape are usable. The on-chip lens 23 is provided for each pixel P as illustrated in FIG. 1; however, this is non-limiting. For example, a single on-chip lens may be provided for a plurality of pixels P.

(1-2. Method of Driving Solid-State Imaging Device)

Figure 6:
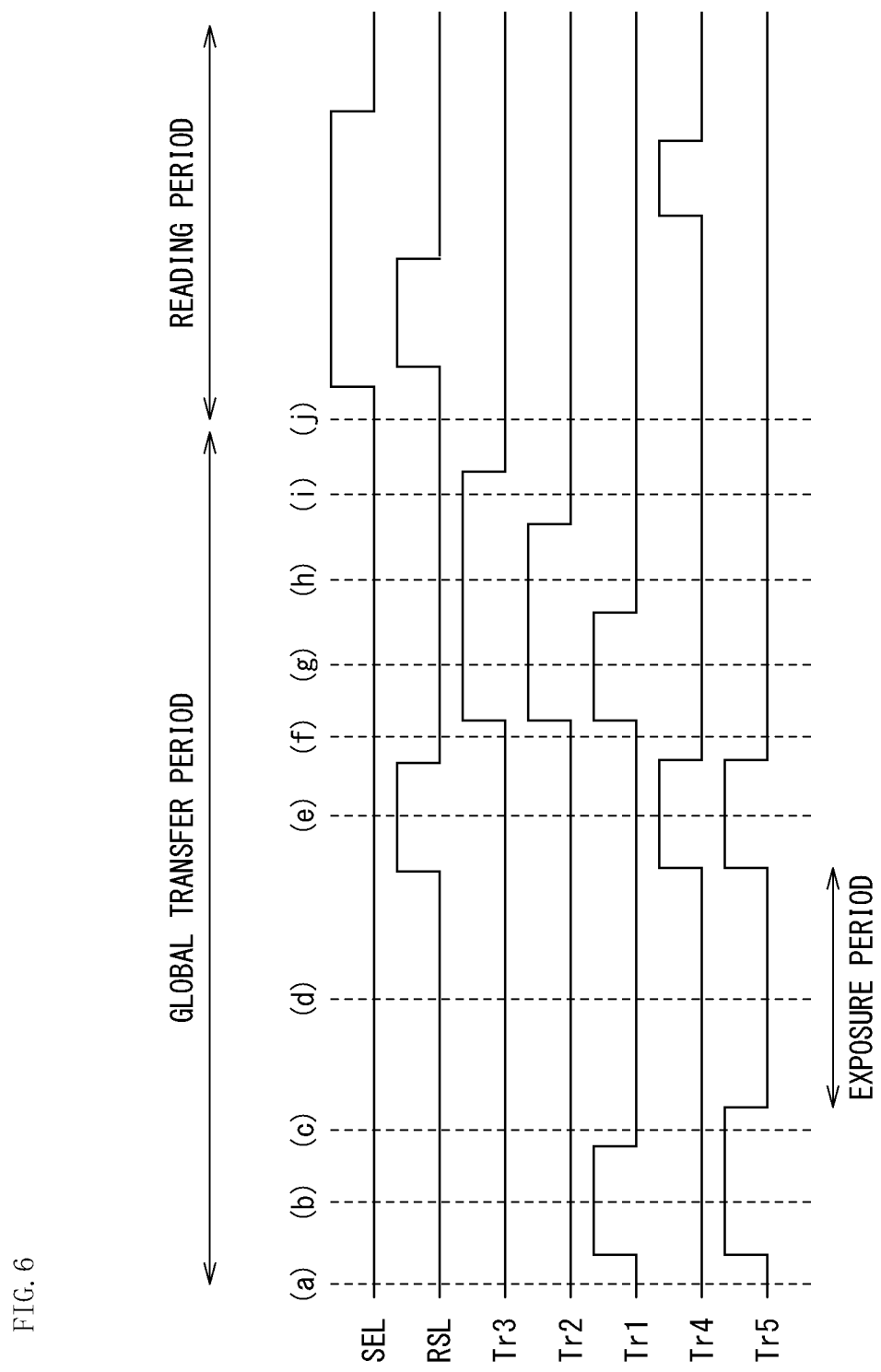
FIG. 6 is a timing chart illustrating an operation example of the solid-state imaging device illustrated in FIG. 1.

FIG. 6 is a timing chart illustrating an operation example of the solid-state imaging device 1 illustrated in FIG. 1. For the solid-state imaging device 1, a global transfer period during which signal charges are accumulated in each pixel P and a reading period during which the accumulated signal charges are read are combined to constitute one frame. By repeating the frame, a signal of light detected in the photoelectric conversion section 11 is acquired. FIGS. 7A to 7J represent potential diagrams at respective timings (a) to (j) in the global transfer period and the reading period illustrated in FIG. 6.

Figure 7A:
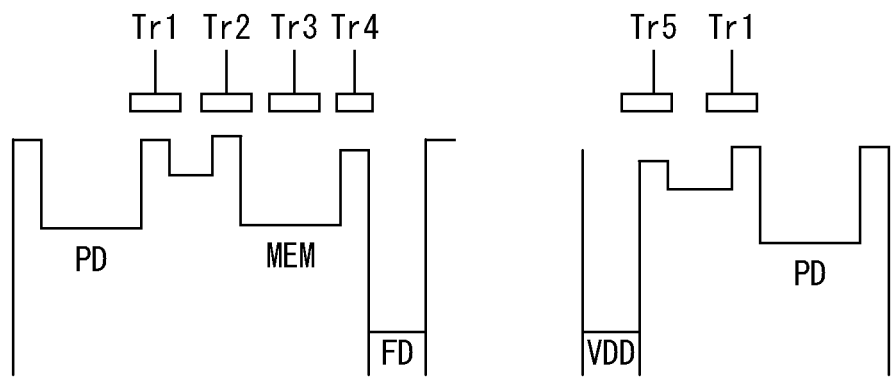
FIG. 7A is a potential diagram at timing (a) illustrated in FIG. 6.
Figure 7B:
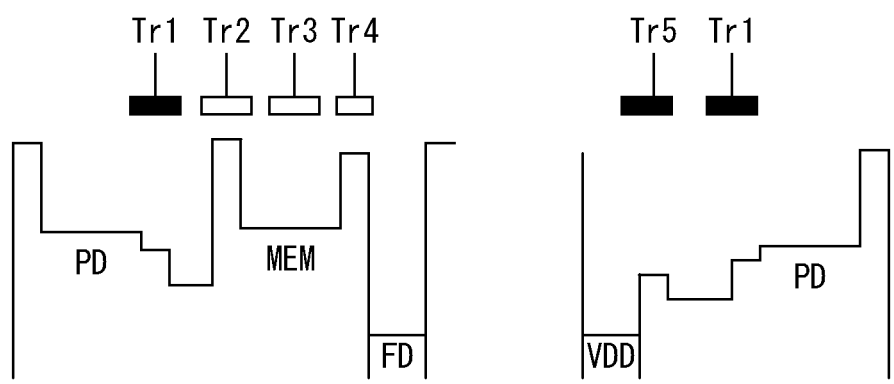
FIG. 7B is a potential diagram at timing (b) illustrated in FIG. 6.
Figure 7C:
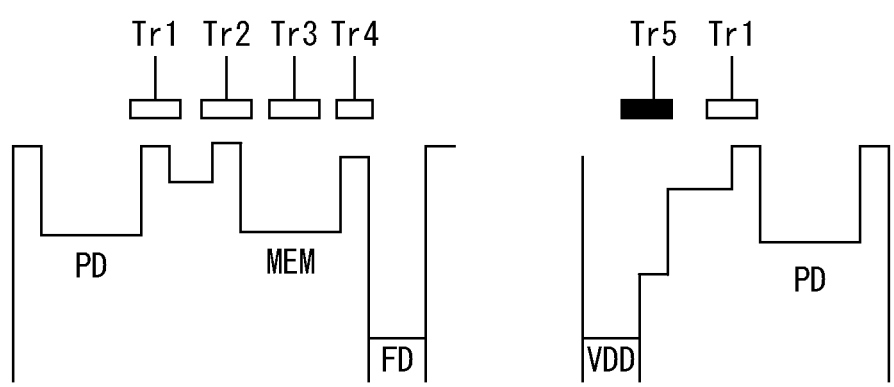
FIG. 7C is a potential diagram at timing (c) illustrated in FIG. 6.
Figure 7D:
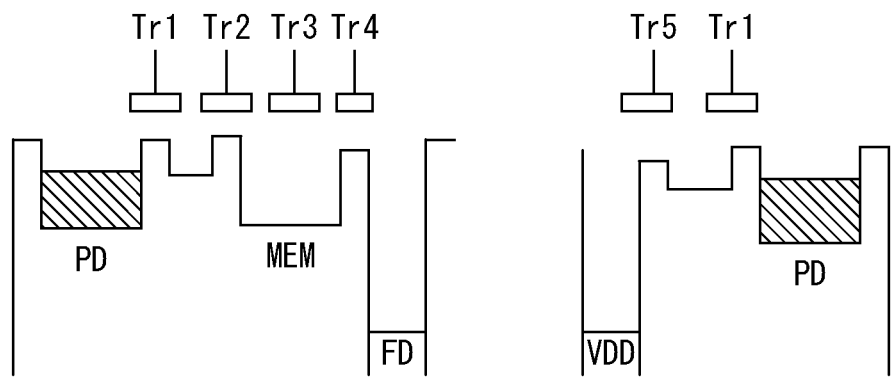
FIG. 7D is a potential diagram at timing (d) illustrated in FIG. 6.

First, from an initial state (timing (a)) illustrated in FIG. 7A, a reset (depletion) of the photoelectric conversion section 11 (PD) is performed during a period from timing (b) to timing (c). Specifically, as illustrated in FIG. 7B, the transfer transistor Tr1 and the transfer transistor Tr5 are turned on (timing (b)), and thereafter, as illustrated in FIG. 7C, the transfer transistor Tr1 is turned off (timing (c)). As a result, the photoelectric conversion section 11 is depleted, an exposure period is started, and the signal charges are accumulated in the photoelectric conversion section 11 (PD) (timing (d)) as illustrated in FIG. 7D.

Figure 7E:
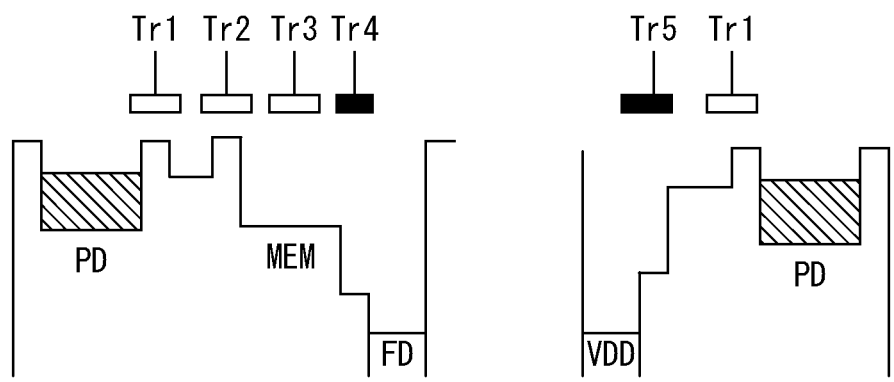
FIG. 7E is a potential diagram at timing (e) illustrated in FIG. 6.
Figure 7F:
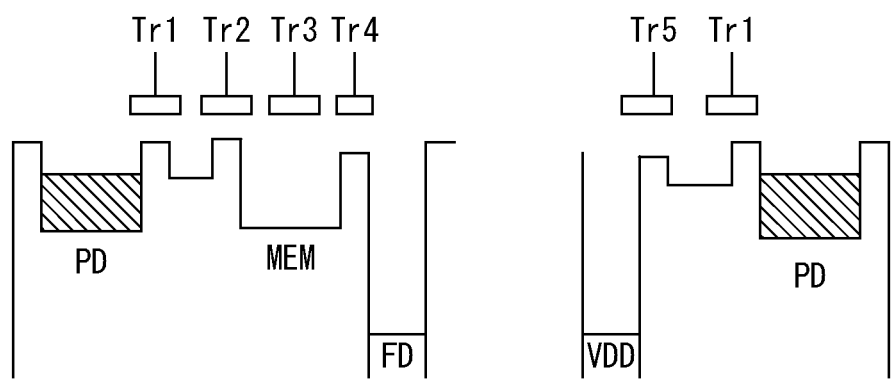
FIG. 7F is a potential diagram at timing (f) illustrated in FIG. 6.

Subsequently, as illustrated in FIG. 7E, the transfer transistor Tr4 and the transfer transistor Tr5 are turned on to reset the memory section 12 (MEM) and the buffer region 13 (timing (e)). At this time, the reset of the memory section 12 (MEM) is performed on the floating diffusion FD side and the reset of the buffer region 13 is performed on the transfer transistor Tr5 side. As a result, as illustrated in FIG. 7F, the reset of the memory section 12 (MEM) and the buffer region 13 is completed (timing (f)).

Figure 7G:
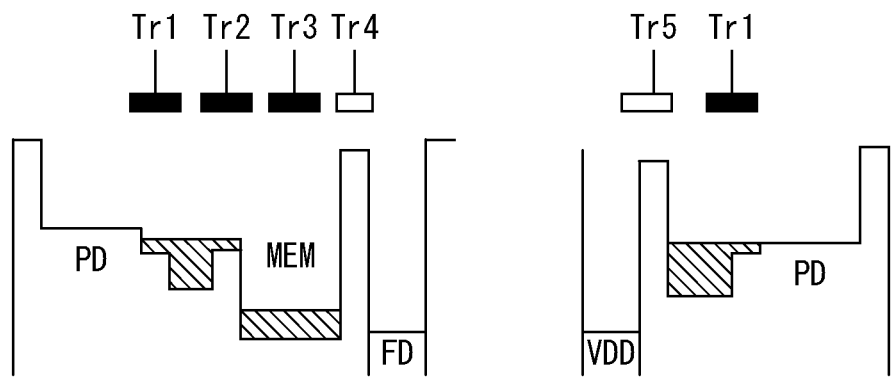
FIG. 7G is a potential diagram at timing (g) illustrated in FIG. 6.
Figure 7H:
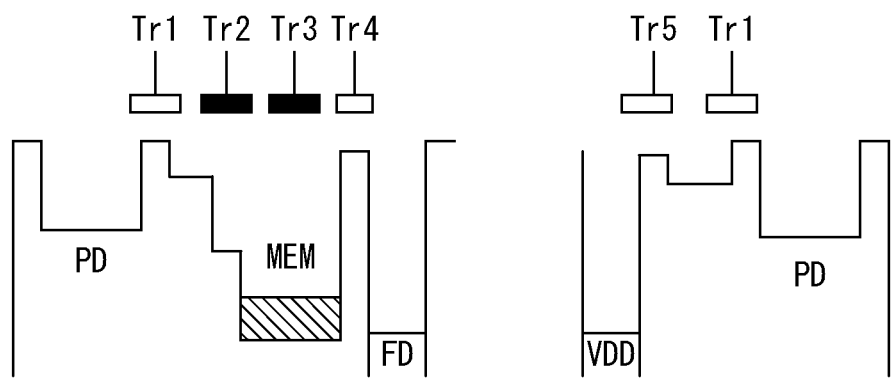
FIG. 7H is a potential diagram at timing (h) illustrated in FIG. 6.
Figure 7I:
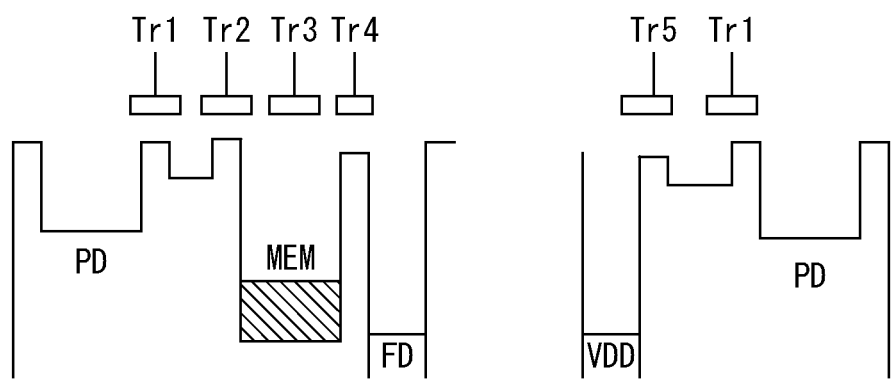
FIG. 7I is a potential diagram at timing (i) illustrated in FIG. 6.
Figure 7J:
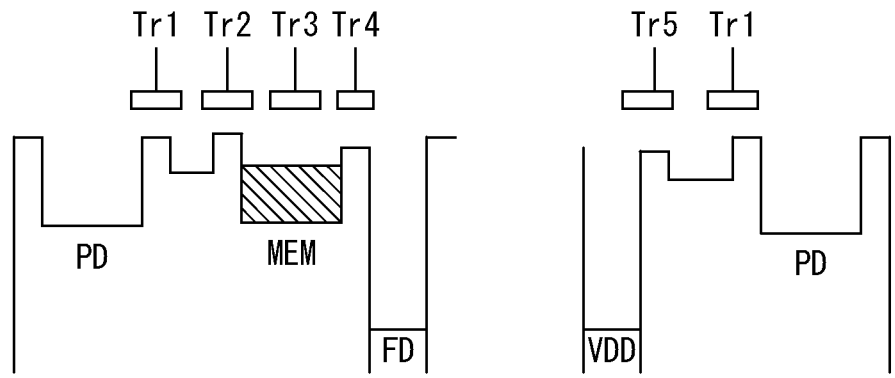
FIG. 7J is a potential diagram at timing (j) illustrated in FIG. 6.

Next, the signal charges accumulated in the photoelectric conversion section 11 (PD) are transferred to the memory section 12 (MEM). Specifically, as illustrated in FIG. 7G, the transfer transistors Tr1, Tr2, and Tr3 are turned on in order, whereby transfer of the signal charges accumulated in the photoelectric conversion section 11 (PD) to the memory section 12 (MEM) is started (timing (g)). Subsequently, as illustrated in FIG. 7H, the transfer transistor Tr1 is turned off (timing (h)) and thereafter, as illustrated in FIG. 7I, the transfer transistor Tr2 is turned off (timing (i)). Finally, as illustrated in FIG. 7J, the transfer transistor Tr3 is turned off (timing (j)). The transfer of the signal charges from the photoelectric conversion section 11 (PD) to the memory section 12 (MEM) is thus completed.

(1-3. Workings and Effects)

Examples of the solid-state imaging device include a CMOS image sensor (CIS) that reads optical charges accumulated in a pn junction capacitance of a photodiode (PD), which is a photoelectric conversion device, through an MOS transistor. The CIS performs an operation of reading the optical charges accumulated in the photodiode (PD) on a pixel-by-pixel basis or a row-by-row basis, for example. It is therefore not possible to cause exposure periods, during which the optical charges are to be accumulated, in all the pixels to coincide with each other. This causes a distortion to occur in a case where a subject is moving during shooting.

Figure 8:
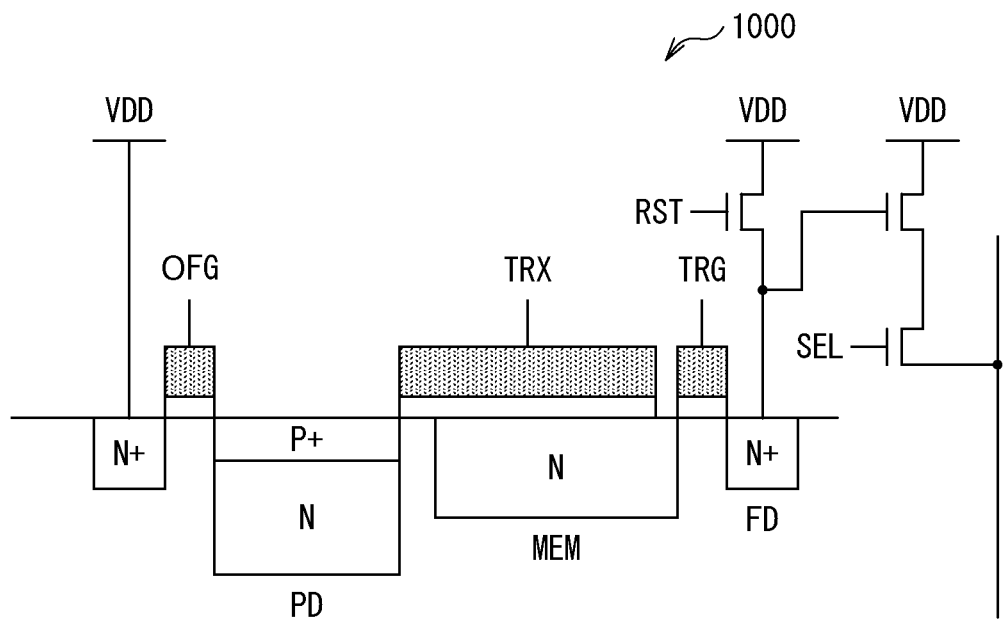
FIG. 8 is a diagram illustrating a configuration of a typical GS-CIS.

To address this issue, as illustrated in FIG. 8, a global shutter back-illumination type CMOS image sensor having a global shutter (GS) function (GS-CIS (solid-state imaging device 1000)) has been developed in which the memory section (MEM) is provided aside from the floating diffusion layer (floating diffusion FD) in a pixel. In the solid-state imaging device 1000, optical charges accumulated in the photodiode PD, which is a photoelectric conversion section, are temporarily held in the memory section (MEM). It is thereby possible to cause the exposure periods, during which the optical charges are to be accumulated, in all of the pixels to coincide with each other. This enables distortion-free shooting even if the subject is moving.

However, in the solid-state imaging device 1000 in which the photodiode (PD) and the memory section (MEM) are arranged in parallel to each other in a semiconductor substrate in a unit pixel as illustrated in FIG. 8, due to area constraints, it is difficult to improve the saturation signal amount Qs, and it is difficult to improve sensitivity.

As a solution to this issue, as described above, a stacked GS-CIS has been reported that achieves improvement in sensitivity by providing the photodiode (PD) and the memory section (MEM) in different layers in the semiconductor substrate and stacking them to thereby increase the respective areas. However, for the stacked GS-CIS, there remains a problem of leakage of charges (blooming) from the photodiode (PD) to the memory section (MEM).

Figure 9:
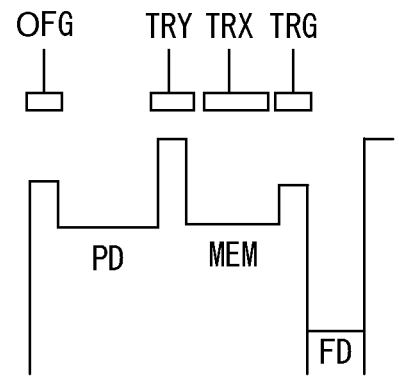
FIG. 9 is a potential diagram of a stacked GS-CIS.

FIG. 9 illustrates a potential diagram of the stacked GS-CIS. In order to improve the saturation signal amount, it is effective to raise potential barriers of an OFG and a TRY. However, the potential barrier of the OFG has to be designed to be lower than the potential barrier of the TRY in order to prevent the aggravation of blooming. Therefore, in practice, it is difficult to raise the potential barrier to the limit.

In contrast, in the solid-state imaging device 1 of the present embodiment, the buffer region 13 is provided in the surface (surface S1) of the semiconductor substrate 10 where the memory section 12 is formed, the memory section 12 being stacked on the photoelectric conversion section 11 formed to be embedded in the semiconductor substrate 10. The buffer region 13 is formed at a position on the transfer path for the signal charges accumulated in the photoelectric conversion section 11 to the memory section 12. Specifically, the buffer region 13 is provided at a position overlapping at least partially with the gate of a transfer transistor (for example, the transfer transistor Tr1) located directly upstream the memory section 12. This allows the signal charges accumulated in the photoelectric conversion section 11 to be transferred via the buffer region 13 to the memory section 12.

As described above, in the present embodiment, the buffer region 13 is provided in the surface (surface S1) of the semiconductor substrate 10 where the memory section 12 stacked on the photoelectric conversion section 11 is formed. This allows the signal charges accumulated in the photoelectric conversion section 11 to be transferred via the buffer region 13 to the memory section 12. This reduces direct movement of charges from the photoelectric conversion section 11 to the memory section 12, thus making it possible to improve the saturation signal amounts of the photoelectric conversion section 11 and the memory section 12. It is thus possible to provide the solid-state imaging device 1 having a high sensitivity and an electronic apparatus including the same.

In addition, in the present embodiment, between the photoelectric conversion section 11 and the memory section 12, the separation film 15 is provided that has a peripheral end face coupled to the pixel separation groove 14 and has the opening 15H at the position corresponding to the VG of the transfer transistor Tr1 configured by a vertical transistor, the VG serving as a connection to the photoelectric conversion section 11, and the separation film 15 and the buffer region 13 are brought into contact with each other. As a result, the memory section 12 is surrounded by the buffer region 13, the pixel separation groove 14, and the separation film 15, and is thereby electrically separated from the photoelectric conversion section 11 completely. This makes it possible to further reduce direct movement of charges from the photoelectric conversion section 11 to the memory section 12. Accordingly, it becomes possible to raise the potential barrier of the transfer transistor Tr5 provided between the buffer region 13 and the power supply VDD to the maximum extent possible without a concern for aggravation of blooming. It is therefore possible to further improve the saturation signal amounts of the photoelectric conversion section 11 and the memory section 12.

Further, in the present embodiment, because the separation film 15 includes a material having a light shielding property, it is possible to prevent light transmitted through the photoelectric conversion section 11 from entering the memory section 12, and it is thus possible to reduce the generation of a false signal in the memory section 12.

Next, a second and a third embodiment and modification examples of the present disclosure will be described. In the following, the components similar to those of the foregoing first embodiment are denoted by the same reference numerals, and descriptions thereof are omitted as appropriate.

<2. Modification Example>

Figure 10:
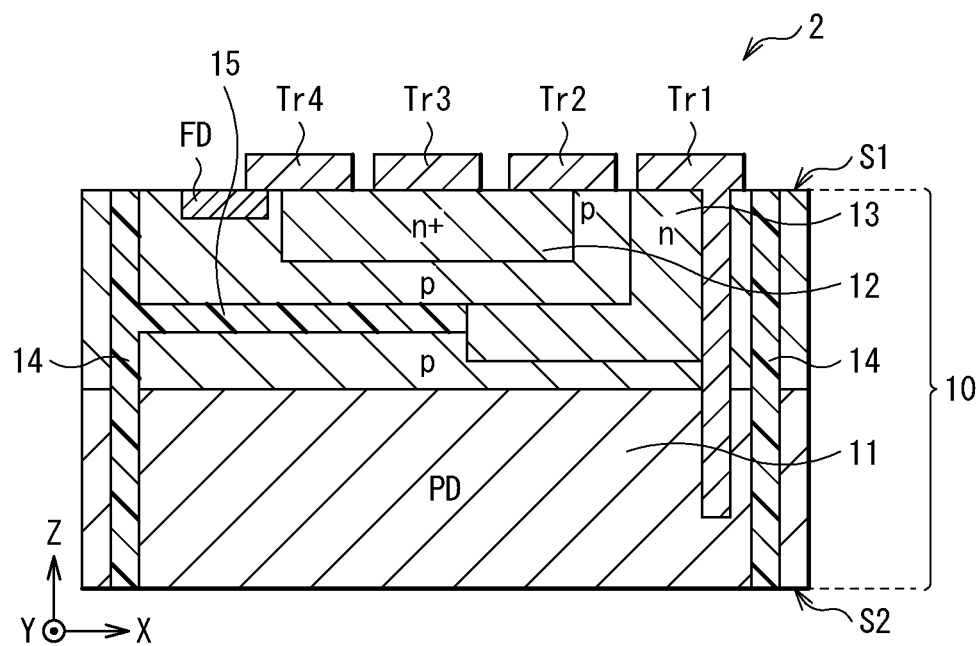
FIG. 10 is a schematic cross-sectional view of an example of a configuration of a solid-state imaging device according to a modification example of the present disclosure.

FIG. 10 schematically illustrates a cross-sectional configuration in the Y-axis direction of a solid-state imaging device (solid-state imaging device 2) according to a modification example of the present disclosure. The solid-state imaging device 2 is, as in the first embodiment, a stacked back-illumination type solid-state imaging device having a global shutter function that configures, for example, a CMOS image sensor or the like for use with an electronic apparatus such as a digital still camera or a video camera, and includes the photodiode (PD) and the memory section (MEM) that are stacked.

In the foregoing first embodiment, an example in which the photoelectric conversion section 11 and the memory section 12 are electrically separated from each other using the separation film 15 has been described; however, as in the solid-state imaging device 2 illustrated in FIG. 10, the buffer region 13 may extend to a position between the photoelectric conversion section 11 and the memory section 12, and the buffer region 13 may constitute a portion of the separation film 15. Even with such a configuration, the memory section 12 is surrounded by the buffer region 13, the pixel separation groove 14, and the separation film 15, and is thereby electrically separated from the photoelectric conversion section 11 completely. Therefore, regarding blooming, it is possible to obtain an effect equivalent to that of the first embodiment.

Figure 11:
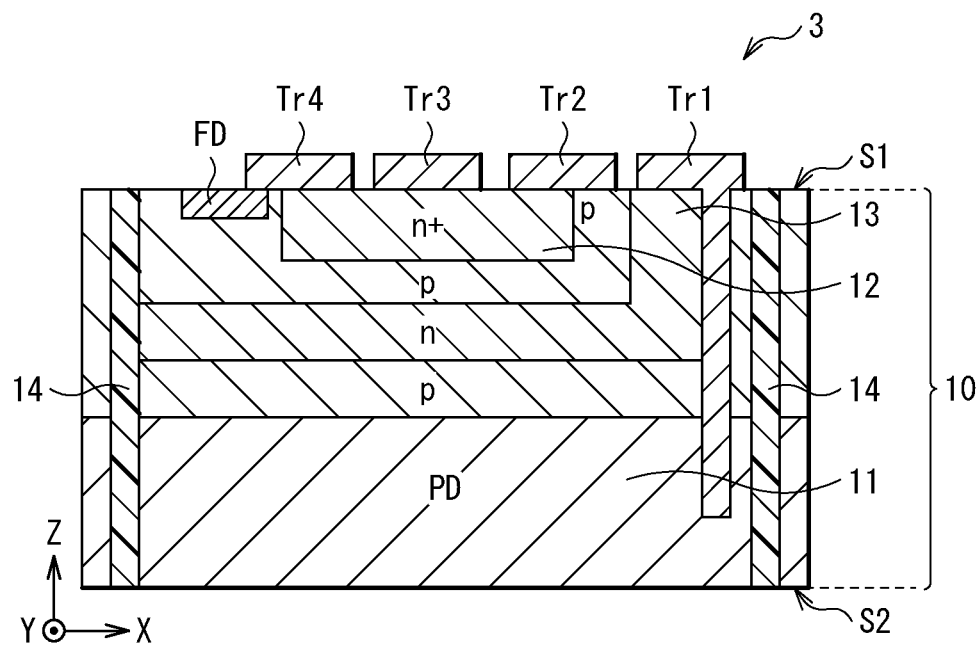
FIG. 11 is a schematic cross-sectional view of another example of a configuration of a solid-state imaging device according to a modification example of the present disclosure.
Figure 12:
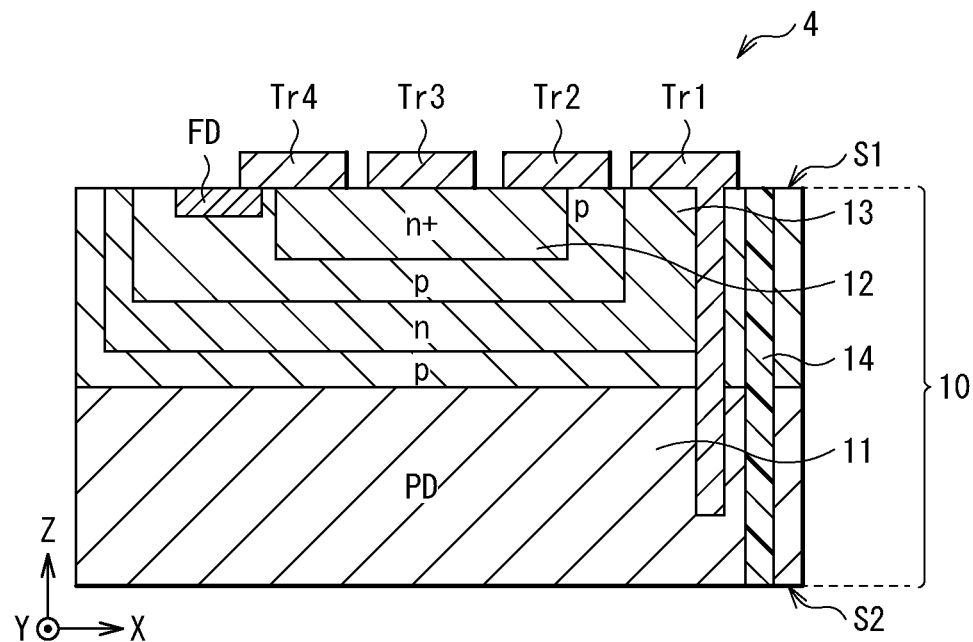
FIG. 12 is a schematic cross-sectional view of another example of a configuration of a solid-state imaging device according to a modification example of the present disclosure.

In other words, in terms of blooming, it is sufficient that the memory section 12 is electrically separated from the photoelectric conversion section 11. Therefore, for example, as in a solid-state imaging device 3 illustrated in FIG. 11, the buffer region 13 may be extended over the entire surface in the pixel P between the photoelectric conversion section 11 and the memory section 12, and the whole of the separation film 15 may be replaced with the buffer region 13. Alternatively, as in a solid-state imaging device 4 illustrated in FIG. 12, the pixel separation groove 14 on the floating diffusion FD side may be replaced with the buffer region 13.

<3. Second Embodiment>

Figure 13:
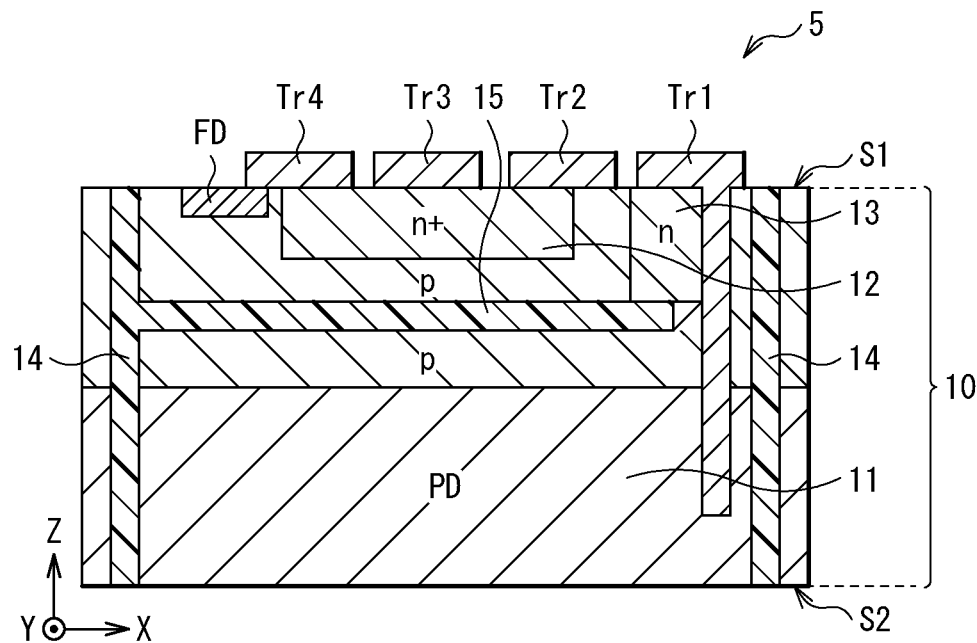
FIG. 13 is a schematic cross-sectional view in the Y-axis direction of a configuration of a solid-state imaging device according to a second embodiment of the present disclosure.
Figure 14:
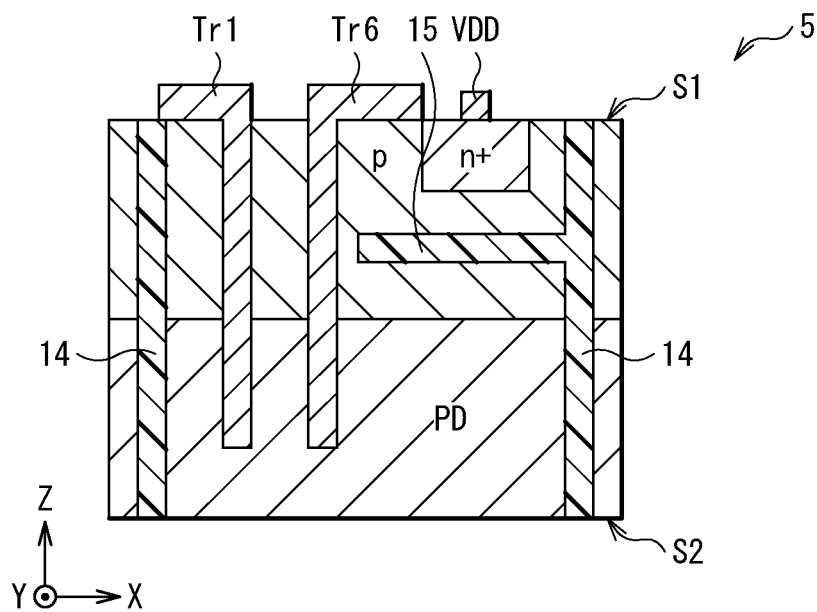
FIG. 14 is a schematic cross-sectional view in the X-axis direction of the configuration of the solid-state imaging device according to the second embodiment of the present disclosure.
Figure 15:
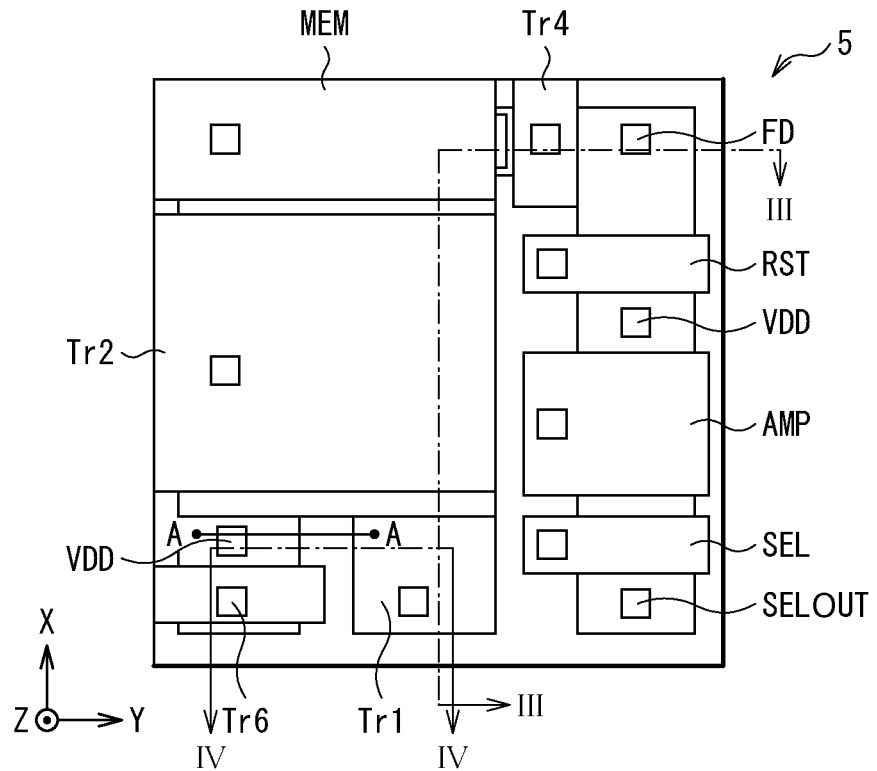
FIG. 15 is a schematic planar diagram illustrating a layout configuration of the transistors of the solid-state imaging device illustrated in FIG. 13.
Figure 16:
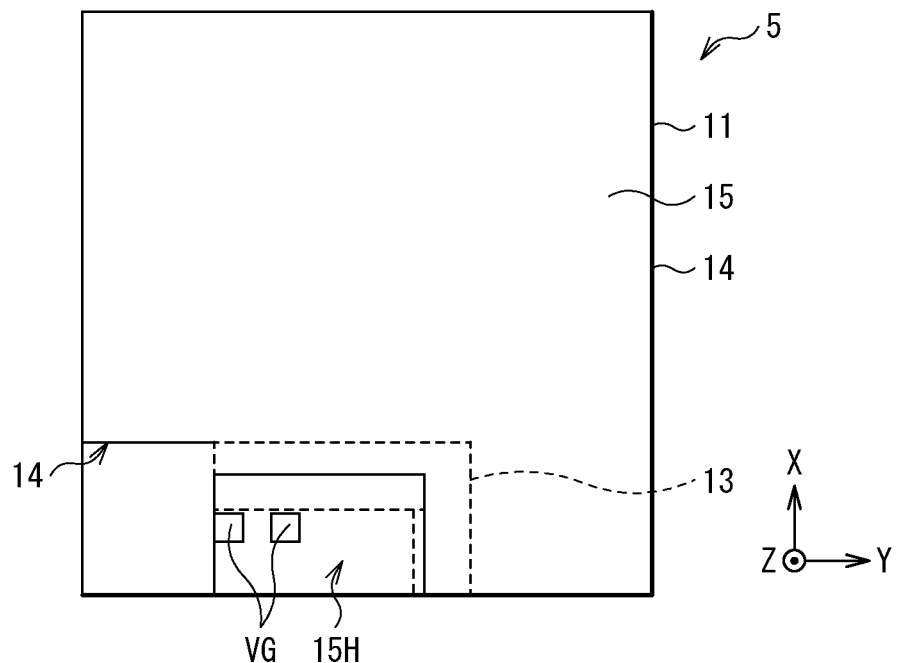
FIG. 16 is a schematic planar diagram illustrating an example of a configuration in another layer of the solid-state imaging device illustrated in FIG. 13.

FIG. 13 schematically illustrates a cross-sectional configuration in the Y-axis direction of a solid-state imaging device (solid-state imaging device 5) according to a second embodiment of the present disclosure. FIG. 14 schematically illustrates a cross-sectional configuration in the X-axis direction of the solid-state imaging device 5. FIG. 15 illustrates a configuration of the transistors of the solid-state imaging device 5 in a plan view. FIG. 16 illustrates a planar configuration in another layer. FIG. 13 illustrates a cross section along line III-III illustrated in FIG. 15. FIG. 15 illustrates a cross section along line IV-IV illustrated in FIG. 16. The solid-state imaging device 5 is, as in the foregoing first embodiment, a stacked back-illumination type solid-state imaging device having a global shutter function that configures, for example, a CMOS image sensor or the like for use with an electronic apparatus such as a digital still camera or a video camera, and includes the photodiode (PD) and the memory section (MEM) that are stacked.

The solid-state imaging device 5 of the present embodiment is configured by replacing the transfer transistor Tr5 provided between the buffer region 13 and the power supply VDD in the solid-state imaging device 1 according to the foregoing first embodiment with a transfer transistor Tr6 and directly coupling its gate to the photoelectric conversion section 11.

It is to be noted that in the solid-state imaging device 5, because of the absence of the transfer transistor Tr5 directly coupled to the buffer region 13, it is preferable that a separate overflow path be provided to prevent the signal charges from overflowing into the memory section 12 from the buffer region 13. For example, by setting a potential barrier in an A-A direction illustrated in FIG. 15 to be lower than a potential barrier of the gate of the transfer transistor Tr6, it is possible for the power supply VDD, which is a drain of the transfer transistor Tr6, to serve as an overflow destination.

Figure 17:
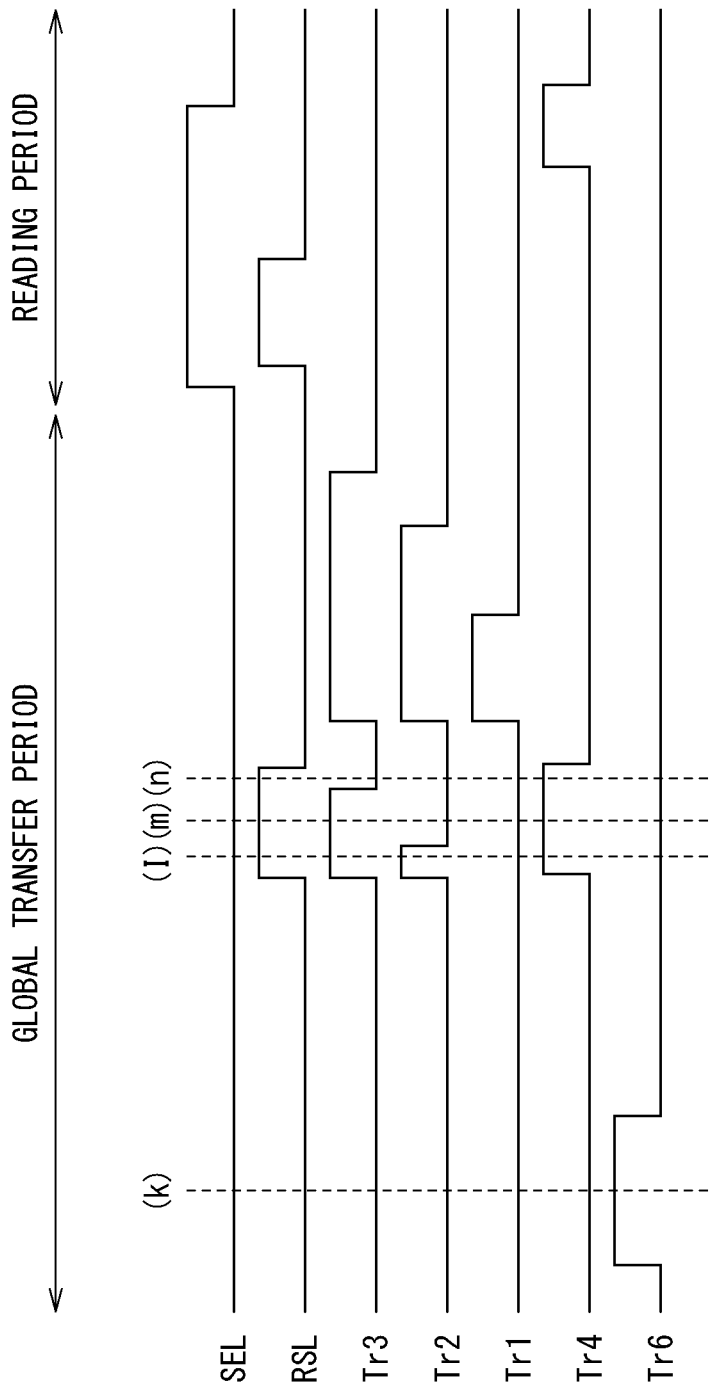
FIG. 17 is a timing chart illustrating an operation example of the solid-state imaging device illustrated in FIG. 13.

FIG. 17 is a timing chart illustrating an operation example of the solid-state imaging device 5 illustrated in FIG. 13. FIGS. 18A to 18D represent potential diagrams at respective timings (a) to (d) in the global transfer period and the reading period illustrated in FIG. 17.

Figure 18A:
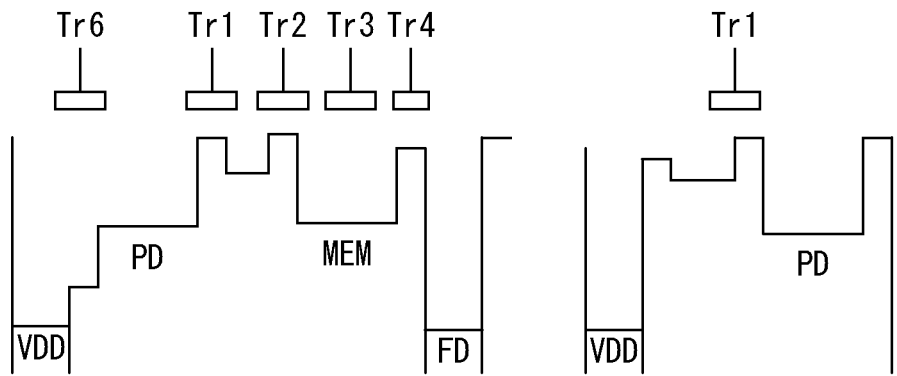
FIG. 18A is a potential diagram at timing (a) illustrated in FIG. 17.
Figure 18B:
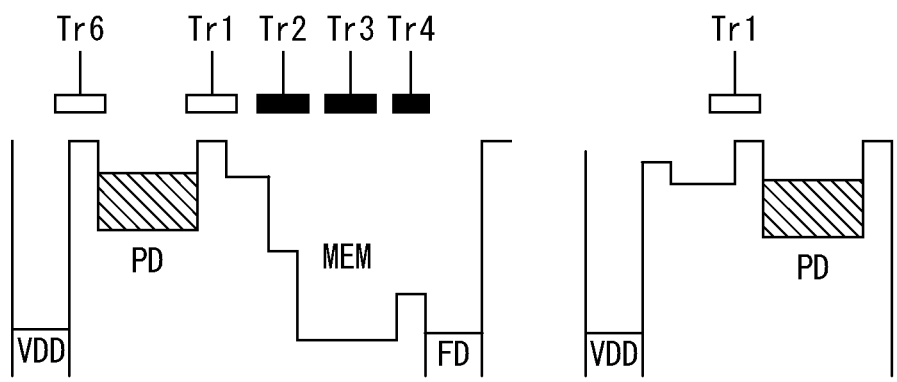
FIG. 18B is a potential diagram at timing (b) illustrated in FIG. 17.
Figure 18C:
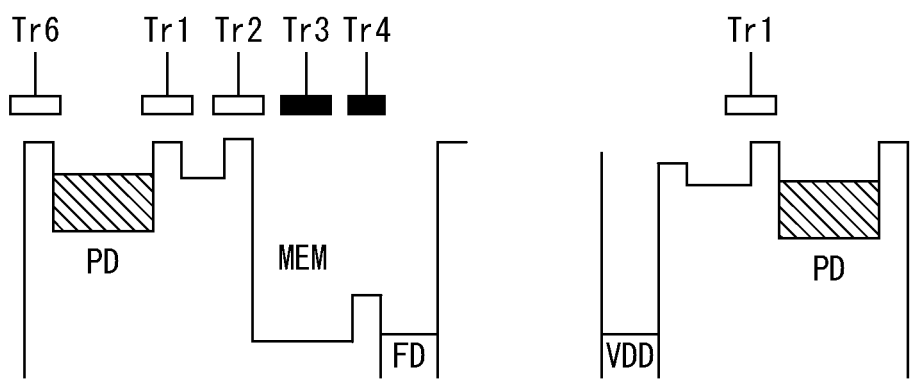
FIG. 18C is a potential diagram at timing (c) illustrated in FIG. 17.
Figure 18D:
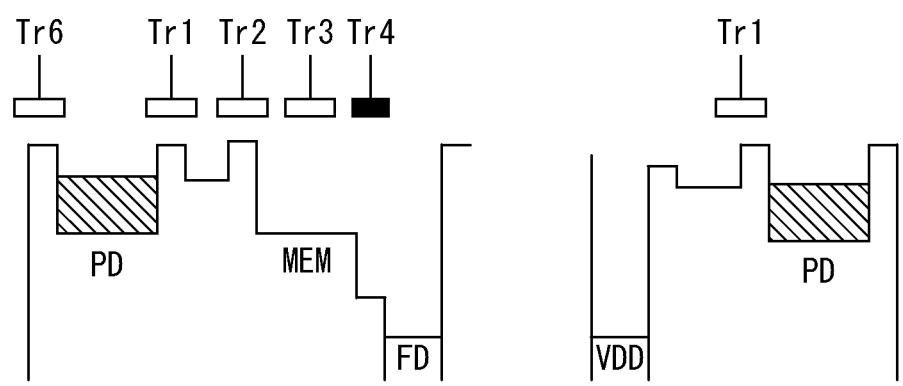
FIG. 18D is a potential diagram at timing (d) illustrated in FIG. 17.

In the solid-state imaging device 5, as illustrated in FIG. 18A, the reset of the photoelectric conversion section 11 (PD) is completed (timing (k)) by turning off the transfer transistor Tr6. It is to be noted that in the solid-state imaging device 5, as described above, because of the absence of a transfer transistor directly coupled to the buffer region 13, it is preferable that the reset of the buffer region 13 be performed at the same time when the memory section 12 is reset. In other words, the reset of the buffer region 13 performed at the timing (e) in the foregoing first embodiment is preferably performed in the following manner. First, as illustrated in FIG. 18B, the transfer transistors Tr1, Tr2, and Tr3 are turned on (timing (l)). Subsequently, as illustrated in FIG. 18C, the transfer transistor Tr3 is turned off (timing (m)) and thereafter, as illustrated in FIG. 18D, the transfer transistor Tr2 is turned off (timing (n)). The reset of the buffer region 13 is thereby completed.

As described above, in the present embodiment, the gate (overflow gate; OFG) of the transfer transistor Tr6 is directly coupled to the photoelectric conversion section 11. This makes it possible to reset the photoelectric conversion section 11 with the transfer transistor Tr6 alone, in addition to producing the effects of the foregoing first embodiment. In other words, because the buffer region 13 is not interposed, there is produced an effect of reducing the shortest exposure time accordingly.

<4. Third Embodiment>

Figure 19:
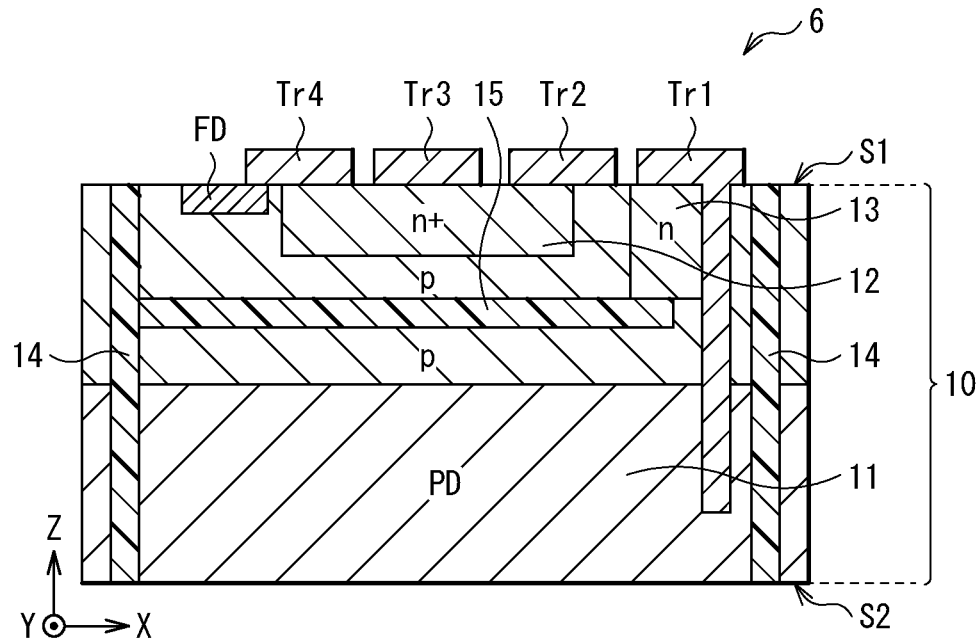
FIG. 19 is a schematic cross-sectional view in the Y-axis direction of a configuration of a solid-state imaging device according to a third embodiment of the present disclosure.
Figure 20:
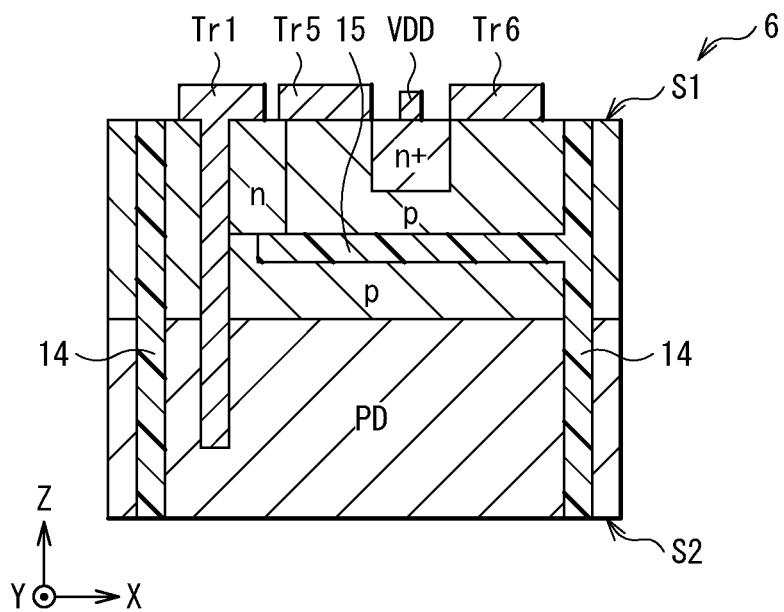
FIG. 20 is a schematic cross-sectional view in the X-axis direction of the configuration of the solid-state imaging device according to the third embodiment of the present disclosure.
Figure 21:
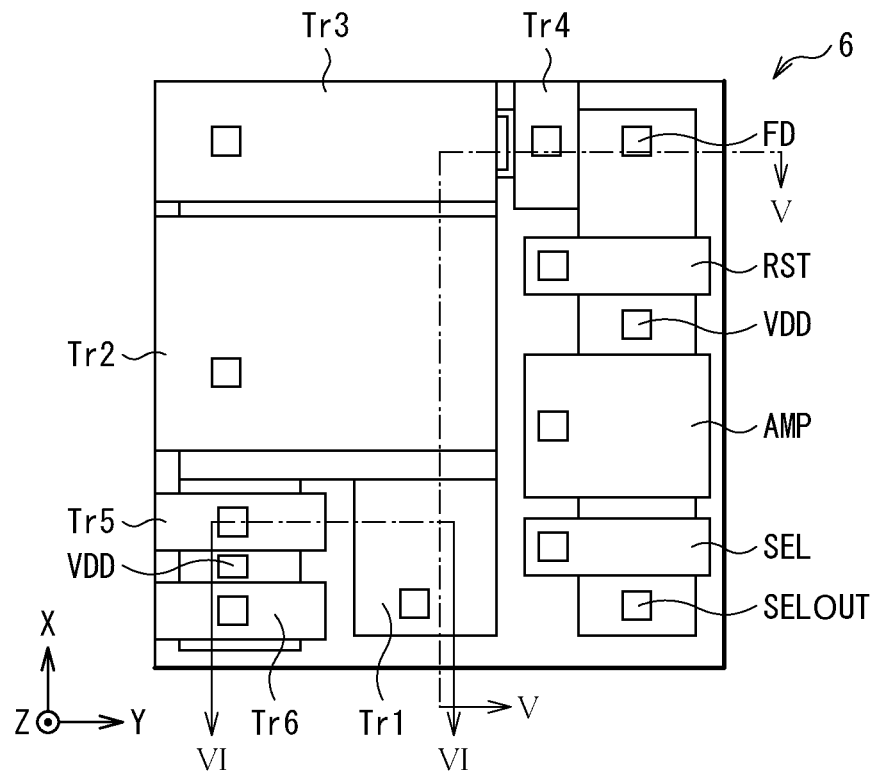
FIG. 21 is a schematic planar diagram illustrating a layout configuration of the transistors of the solid-state imaging device illustrated in FIG. 19.
Figure 22:
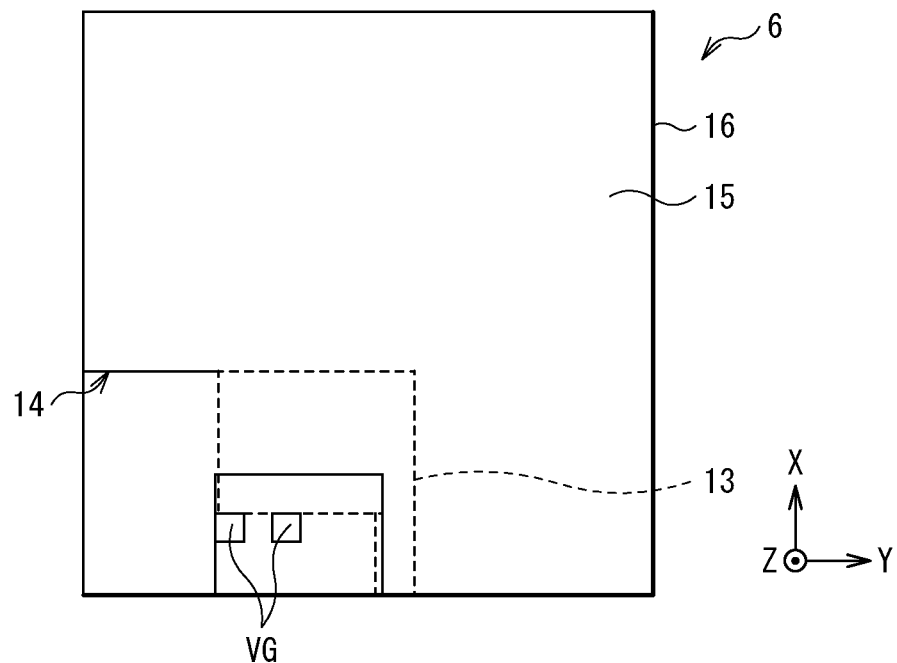
FIG. 22 is a schematic planar diagram illustrating an example of a configuration in another layer of the solid-state imaging device illustrated in FIG. 19.

FIG. 19 schematically illustrates a cross-sectional configuration in the Y-axis direction of a solid-state imaging device (solid-state imaging device 6) according to a third embodiment of the present disclosure. FIG. 20 schematically illustrates a cross-sectional configuration in the X-axis direction of the solid-state imaging device 6. FIG. 21 illustrates a layout configuration of the transistors of the solid-state imaging device 6 in a plan view. FIG. 22 illustrates a planar configuration in another layer. FIG. 19 illustrates a cross section along line V-V illustrated in FIG. 21. FIG. 20 illustrates a cross section along line VI-VI illustrated in FIG. 21. The solid-state imaging device 6 is, as in the foregoing first embodiment, a back-illumination type solid-state imaging device having a global shutter function that configures, for example, a CMOS image sensor or the like for use with an electronic apparatus such as a digital still camera or a video camera, and includes the photodiode (PD) and the memory section (MEM) that are stacked.

The solid-state imaging device 6 according to the present embodiment is configured by combining the solid-state imaging device 1 of the foregoing first embodiment and the solid-state imaging device 5 of the second embodiment, thus being provided with the transfer transistor Tr5 whose gate is directly coupled to the buffer region 13 and the transfer transistor Tr6 whose gate (overflow gate) is directly coupled to the photoelectric conversion section 11. Because the transfer transistor Tr6 is able to directly reset the photoelectric conversion section 11 without the interposition of the buffer region 13, it becomes possible to control the exposure time with the transfer transistor Tr5.

In the solid-state imaging device 6, as illustrated in FIG. 22, the transfer transistor Tr5 and the transfer transistor Tr6 are separated from the memory section 12 by the pixel separation groove 14.

Figure 23:
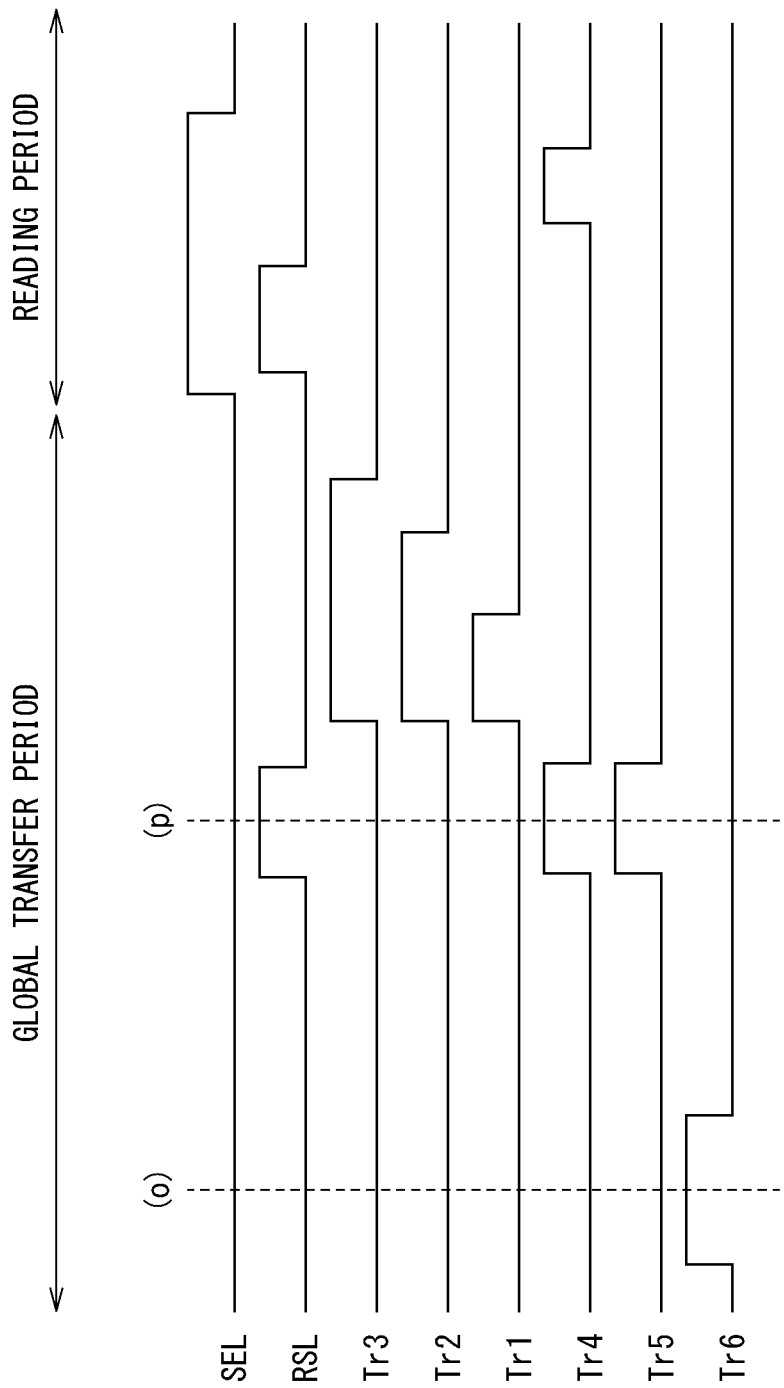
FIG. 23 is a timing chart illustrating an operation example of the solid-state imaging device illustrated in FIG. 19.
Figure 24A:
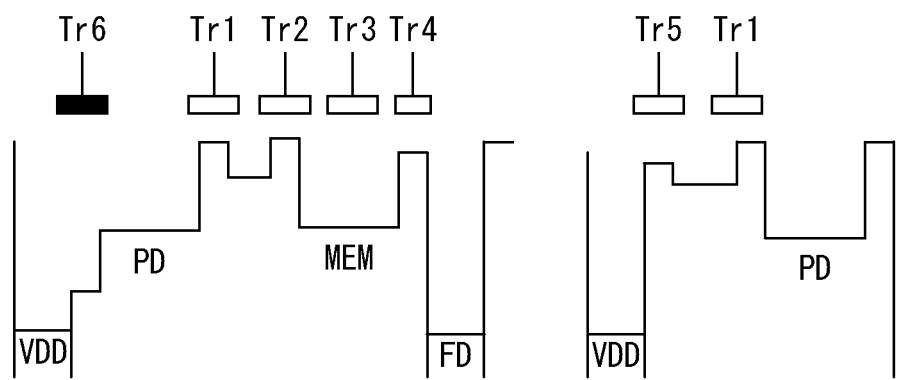
FIG. 24A is a potential diagram at timing (a) illustrated in FIG. 23.
Figure 24B:
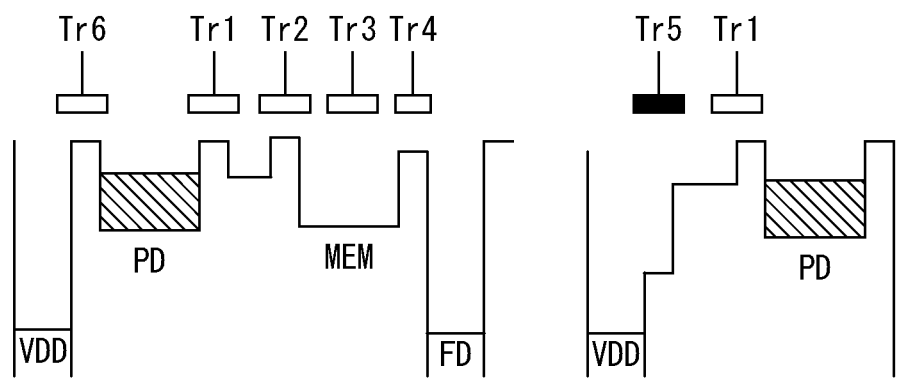
FIG. 24B is a potential diagram at timing (b) illustrated in FIG. 23.

FIG. 23 is a timing chart illustrating an operation example of the solid-state imaging device 6 illustrated in FIG. 19. FIGS. 24A and 24B represent potential diagrams at respective timings (a) and (b) in the global transfer period and the reading period illustrated in FIG. 23.

In the solid-state imaging device 6, as illustrated in FIG. 24A, the reset of the photoelectric conversion section 11 (PD) is completed (timing (o)) by turning on the transfer transistor Tr6. Further, because the solid-state imaging device of the present embodiment includes the transfer transistor Tr5 directly coupled to the buffer region 13, it is possible to reset the buffer region 13 (timing (p)) by turning on the transfer transistor Tr5, as illustrated in FIG. 23B.

As described above, because the transfer transistor Tr5 having the gate directly coupled to the buffer region 13 and the transfer transistor Tr6 having the gate (overflow gate) directly coupled to the photoelectric conversion section 11 are provided, the present embodiment makes it possible to reset the photoelectric conversion section 11 with the transfer transistor Tr6 alone as with the foregoing second embodiment, in addition to producing the effects of the foregoing first embodiment. In other words, because the buffer region 13 is not interposed, there is produced an effect of reducing the shortest exposure time accordingly. Furthermore, there is produced an effect of making it possible to electrically control also the overflow destination of the buffer region 13.

<5. Application Example>
(Application Example 1)

FIG. 25 illustrates the overall configuration of the solid-state imaging device 1 (or the solid-state imaging devices 2 to 6) described in the foregoing first to third embodiments (or the modification examples). The solid-state imaging device 1 is a CMOS image sensor. The solid-state imaging device 1 includes the pixel section 1a as an imaging area on the semiconductor substrate 30, and includes, for example, a peripheral circuit section 130 including a row scanner 131, a horizontal selector 133, a column scanner 134, and a system controller 132 in a peripheral region of the pixel section 1a.

The pixel section 1a includes, for example, a plurality of unit pixels P (corresponding to the solid-state imaging device 1) arranged two-dimensionally in a matrix. To the unit pixels P, for example, pixel drive lines Lread (specifically, row selection lines and reset control lines) are wired on a per-pixel-row basis, and vertical signal lines Lsig are wired on a per-pixel-column basis. The pixel drive line Lread transmits a drive signal for reading of a signal from the pixel. One end of the pixel drive line Lread is coupled to an output terminal corresponding to each row in the row scanner 131.

The row scanner 131 is configured by a shift register, an address decoder, etc. The row scanner 131 is, for example, a pixel driver that drives the respective unit pixels P in the pixel section 1a on a per-row basis. Signals outputted from the respective unit pixels P in the pixel row selectively scanned by the row scanner 131 are supplied to the horizontal selector 133 via the respective vertical signal lines Lsig. The horizontal selector 133 is configured by an amplifier, a horizontal selection switch, etc., that are provided for each vertical signal line Lsig.

The column scanner 134 is configured by a shift register, an address decoder, etc. The column scanner 134 sequentially drives the respective horizontal selection switches in the horizontal selector 133 while scanning the respective horizontal selection switches in the horizontal selector 133. As a result of the selective scanning by the column scanner 134, signals of the respective pixels to be transmitted via the respective vertical signal lines Lsig are sequentially outputted to horizontal signal lines 135, and are transmitted to the outside of the semiconductor substrate 30 through the horizontal signal lines 135.

A circuit part including the row scanner 131, the horizontal selector 133, the column scanner 134, and the horizontal signal lines 135 may be formed directly on the semiconductor substrate 30, or may be arranged in an external control IC. Alternatively, the circuit part may be formed on another substrate coupled with use of a cable or the like.

The system controller 132 receives a clock, data instructing an operation mode, etc., that are supplied from the outside of the semiconductor substrate 30. The system controller 132 also outputs data such as internal information of the solid-state imaging device 1. The system controller 132 further includes a timing generator that generates various timing signals, and performs drive control of peripheral circuits such as the row scanner 131, the horizontal selector 133, and the column scanner 134 on the basis of the various timing signals generated by the timing generator.

(Application Example 2)

Figure 26:
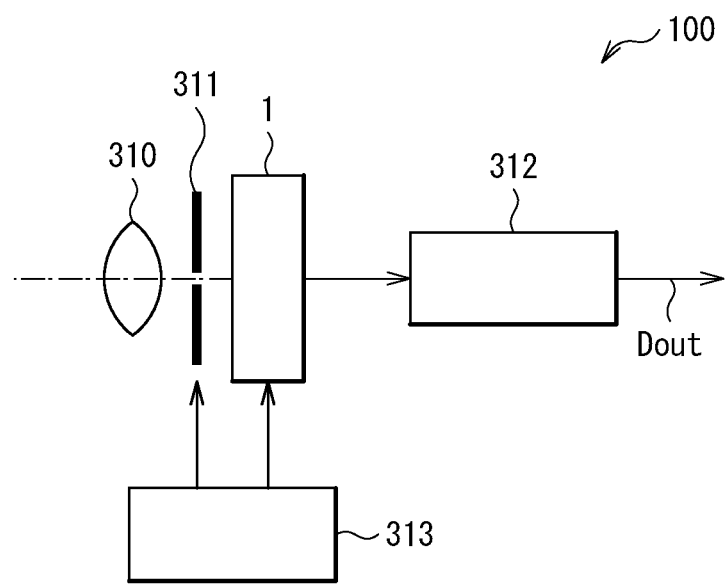
FIG. 26 is a functional block diagram illustrating an example of an electronic apparatus (camera) using the imaging device illustrated in FIG. 1, etc.

The solid-state imaging device 1 described above is applicable to any type of electronic apparatus having an imaging function, examples of which include camera systems including a digital still camera and a video camera, and mobile phones having the imaging function. FIG. 26 illustrates a schematic configuration of an electronic apparatus 100 (camera) as an example thereof. The electronic apparatus 100 is, for example, a video camera that is able to shoot a still image or a moving image, and includes the solid-state imaging device 1, an optical system (optical lens) 310, a shutter unit 311, a driver 313 that drives the solid-state imaging device 1 and the shutter unit 311, and a signal processor 312.

The optical system 310 guides image light (entering light) from a subject to the pixel section 1a in the solid-state imaging device 1. The optical system 310 may include a plurality of optical lenses. The shutter unit 311 controls a period during which the solid-state imaging device 1 is to be irradiated with light and a period during which the light is to be blocked. The driver 313 controls a transfer operation of the solid-state imaging device 1 and a shutter operation of the shutter unit 311. The signal processor 312 performs various kinds of signal processing on a signal outputted from the solid-state imaging device 1. An image signal Dout having been subjected to the signal processing is stored in a storage medium such as a memory or outputted to a monitor or the like.

<6. Example of Practical Application>

Further, the solid-state imaging device 1 is applicable to electronic apparatuses (a capsule type endoscope 10100 and a mobile body such as a vehicle) described below.

<Example of Practical Application to In-Vivo Information Acquisition System>

Further, the technology according to the present disclosure (present technology) is applicable to various products. For example, the technology according to the present disclosure may be applied to an endoscopic surgery system.

Figure 27:
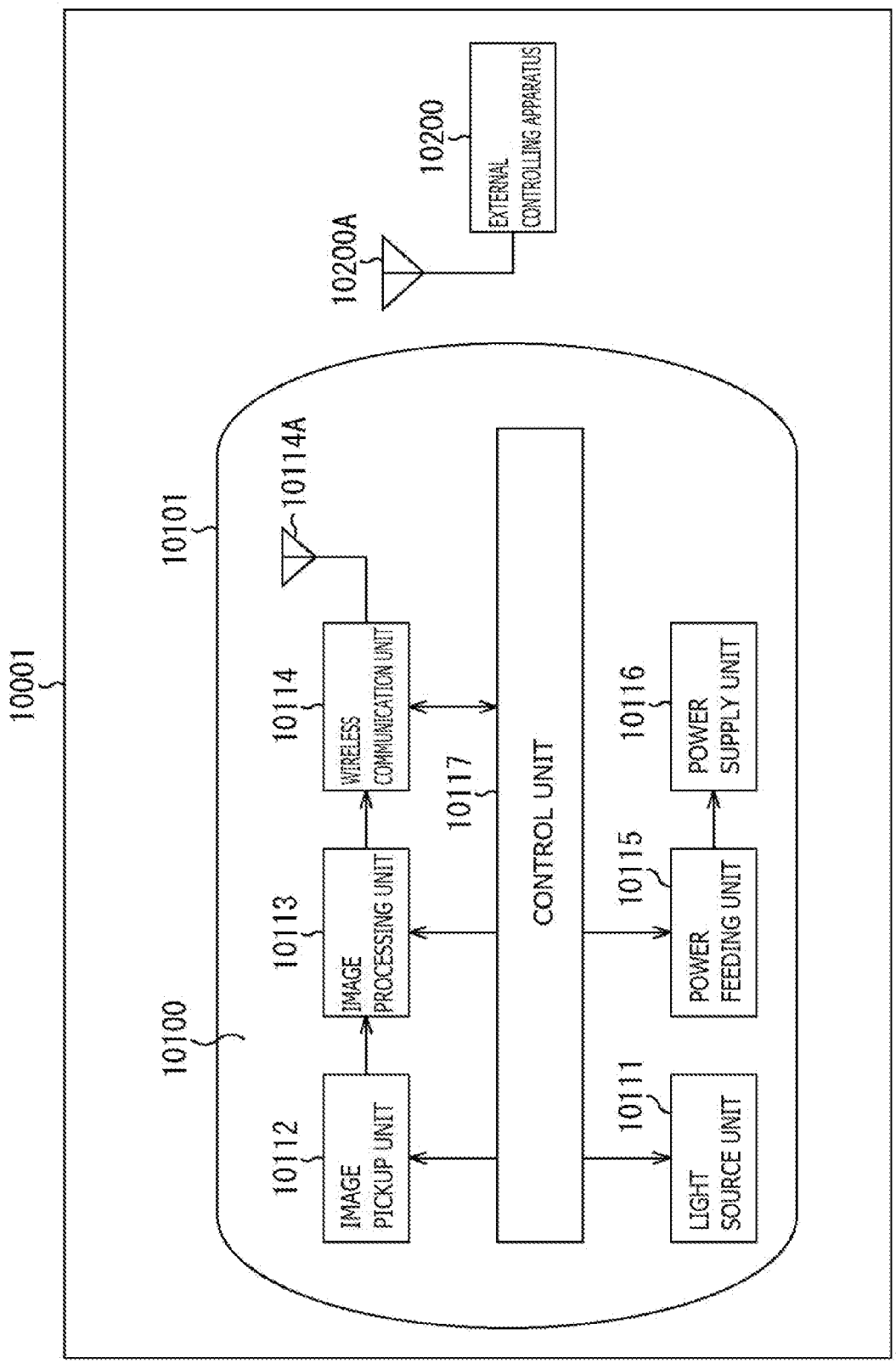
FIG. 27 is a block diagram depicting an example of a schematic configuration of an in-vivo information acquisition system.

FIG. 27 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 27, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

<Example of Practical Application to Endoscopic Surgery System>

The technology (present technology) according to the present disclosure is applicable to various products. For example, the technology according to the present disclosure may be applied to an endoscopic surgery system.

Figure 28:
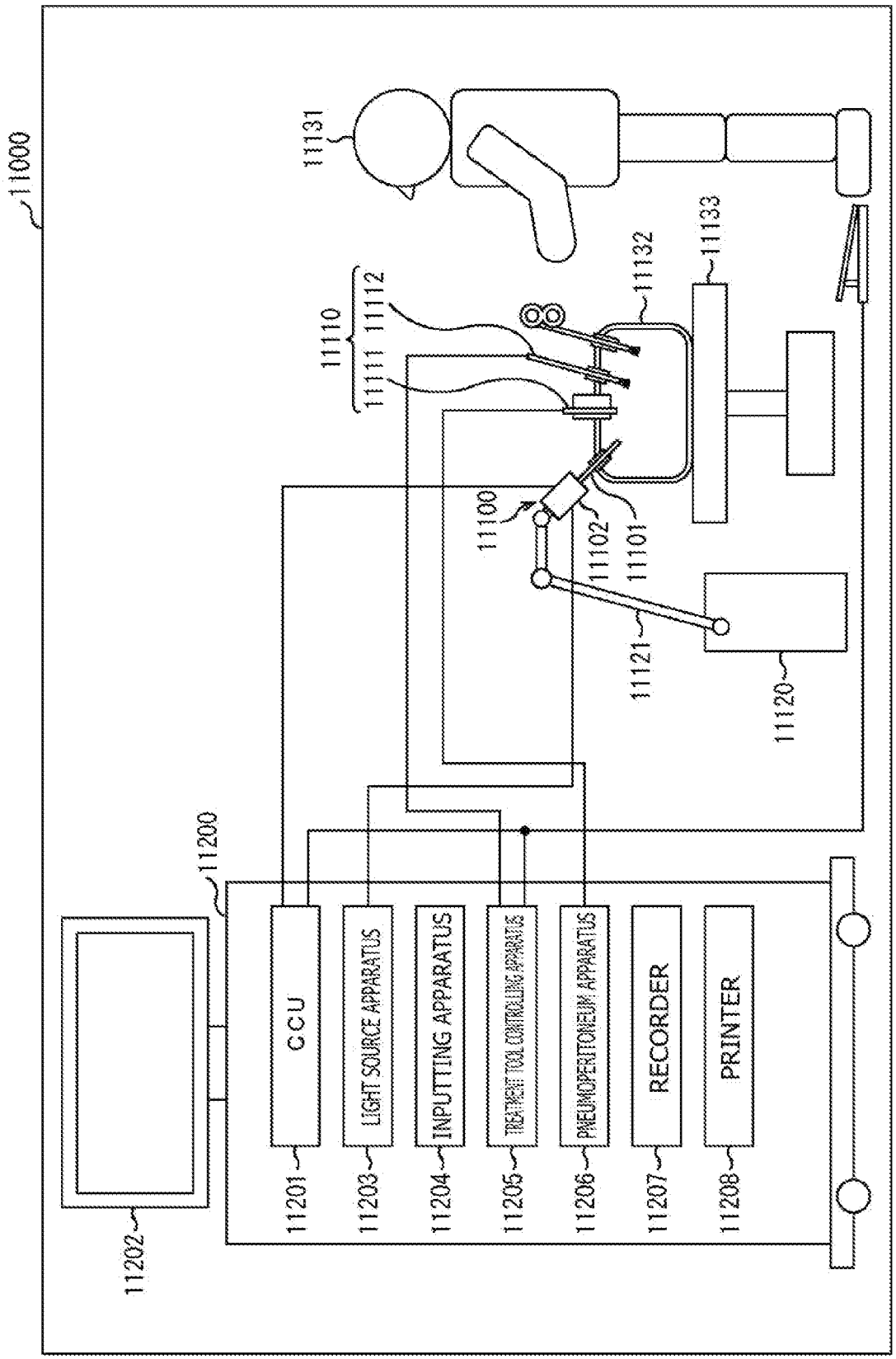
FIG. 28 is a view depicting an example of a schematic configuration of an endoscopic surgery system.

FIG. 28 is a view depicting an example of a schematic configuration of an endoscopic surgery system to which the technology according to an embodiment of the present disclosure (present technology) can be applied.

In FIG. 28, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 29:
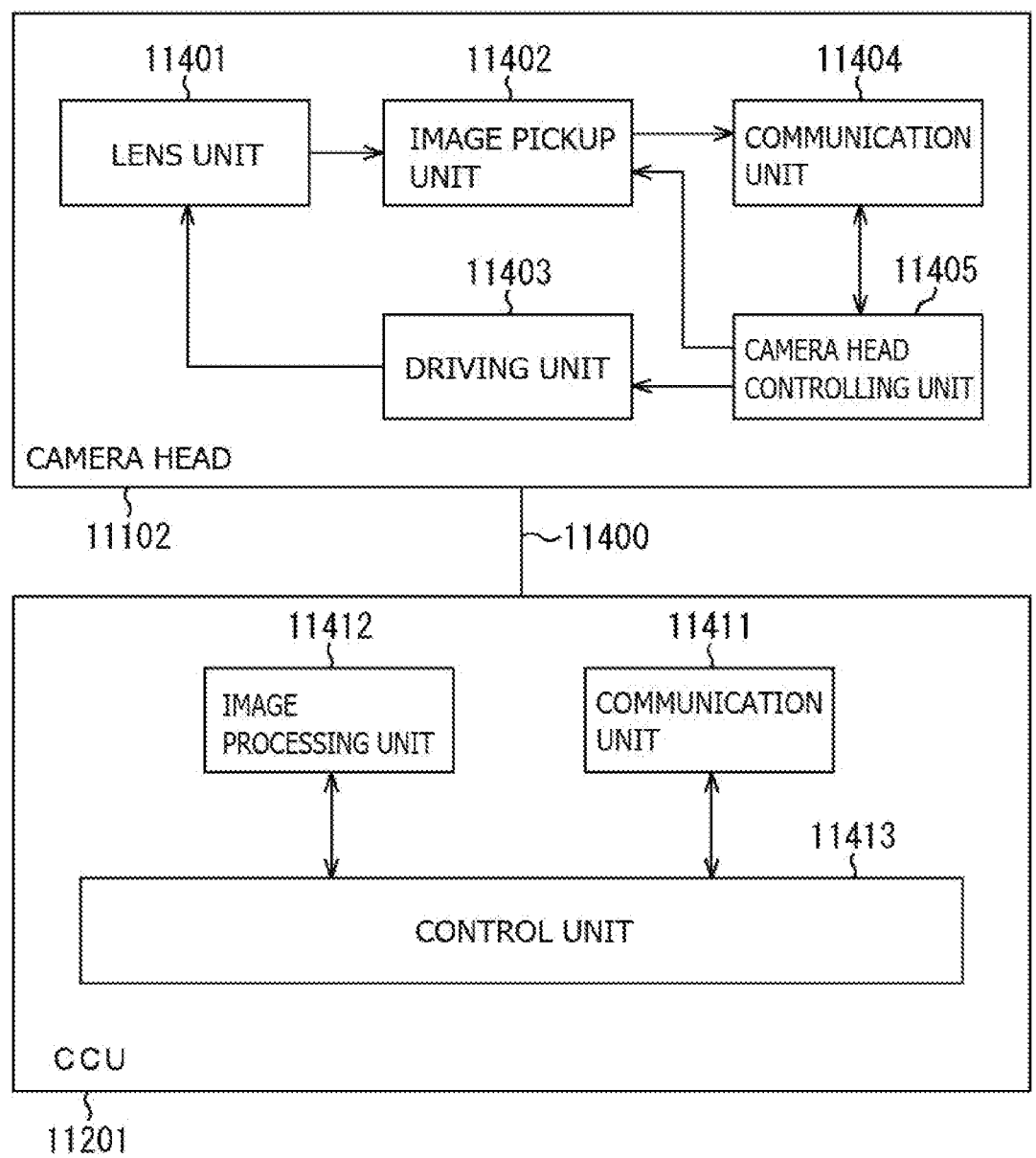
FIG. 29 is a block diagram depicting an example of a functional configuration of a camera head and a camera control unit (CCU).

FIG. 29 is a block diagram depicting an example of a functional configuration of the camera head 11102 and the CCU 11201 depicted in FIG. 28.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

<Example of Practical Application to Mobile Body>

The technology according to an embodiment of the present disclosure (present technology) is applicable to various products. For example, the technology according to an embodiment of the present disclosure may be implemented as a device to be mounted on any type of mobile body such as an automobile, an electric vehicle, a hybrid electric vehicle, a motorcycle, a bicycle, a personal mobility, an airplane, a drone, a vessel, a robot, a construction machine, and an agricultural machine (tractor).

Figure 30:
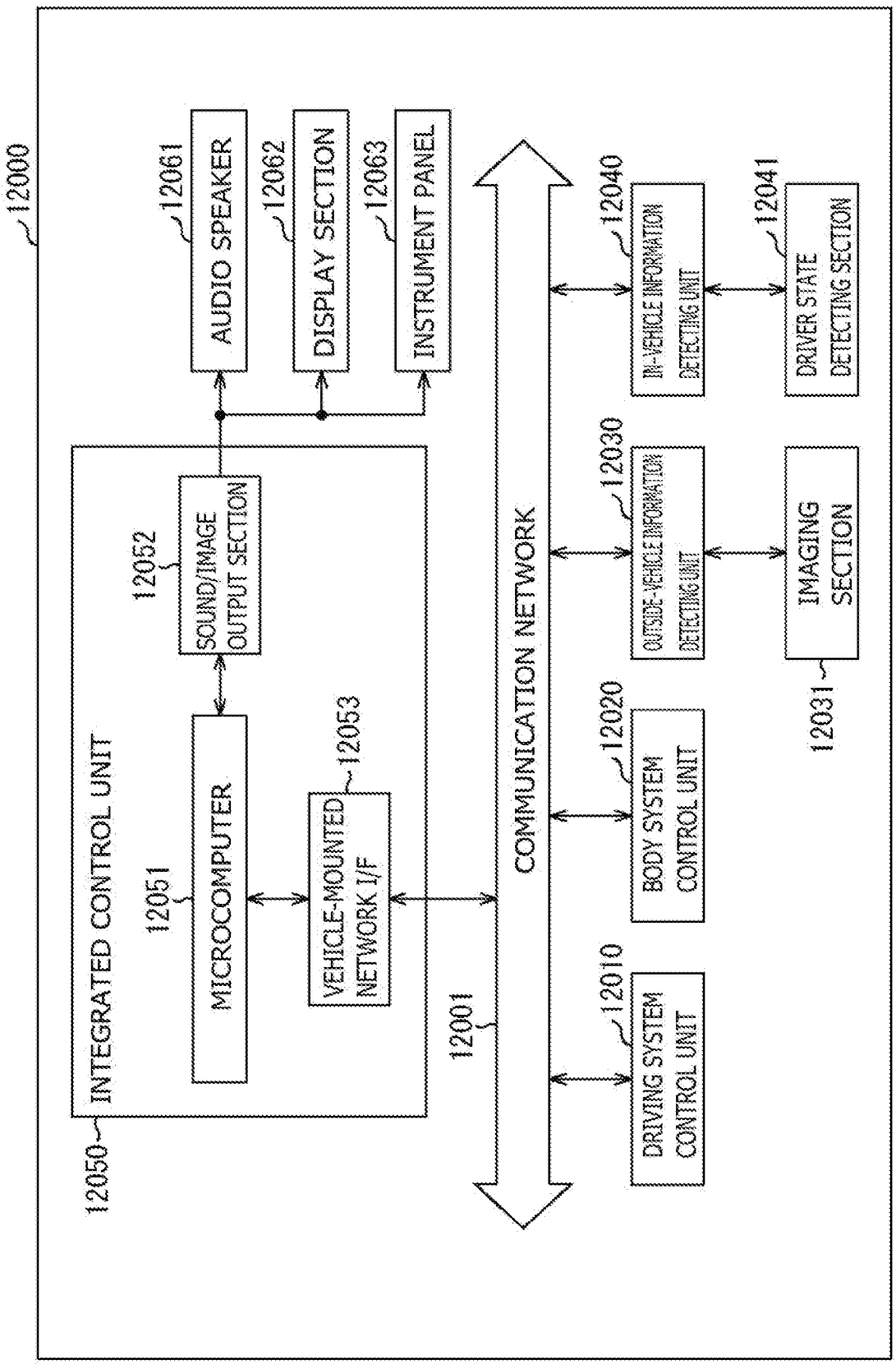
FIG. 30 is a block diagram depicting an example of schematic configuration of a vehicle control system.

FIG. 30 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 30, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 30, an audio speaker 12061, a display section 12062, and an instrument panel 12063 are illustrated as the output device. The display section 12062 may, for example, include at least one of an on-board display and a head-up display.

Figure 31:
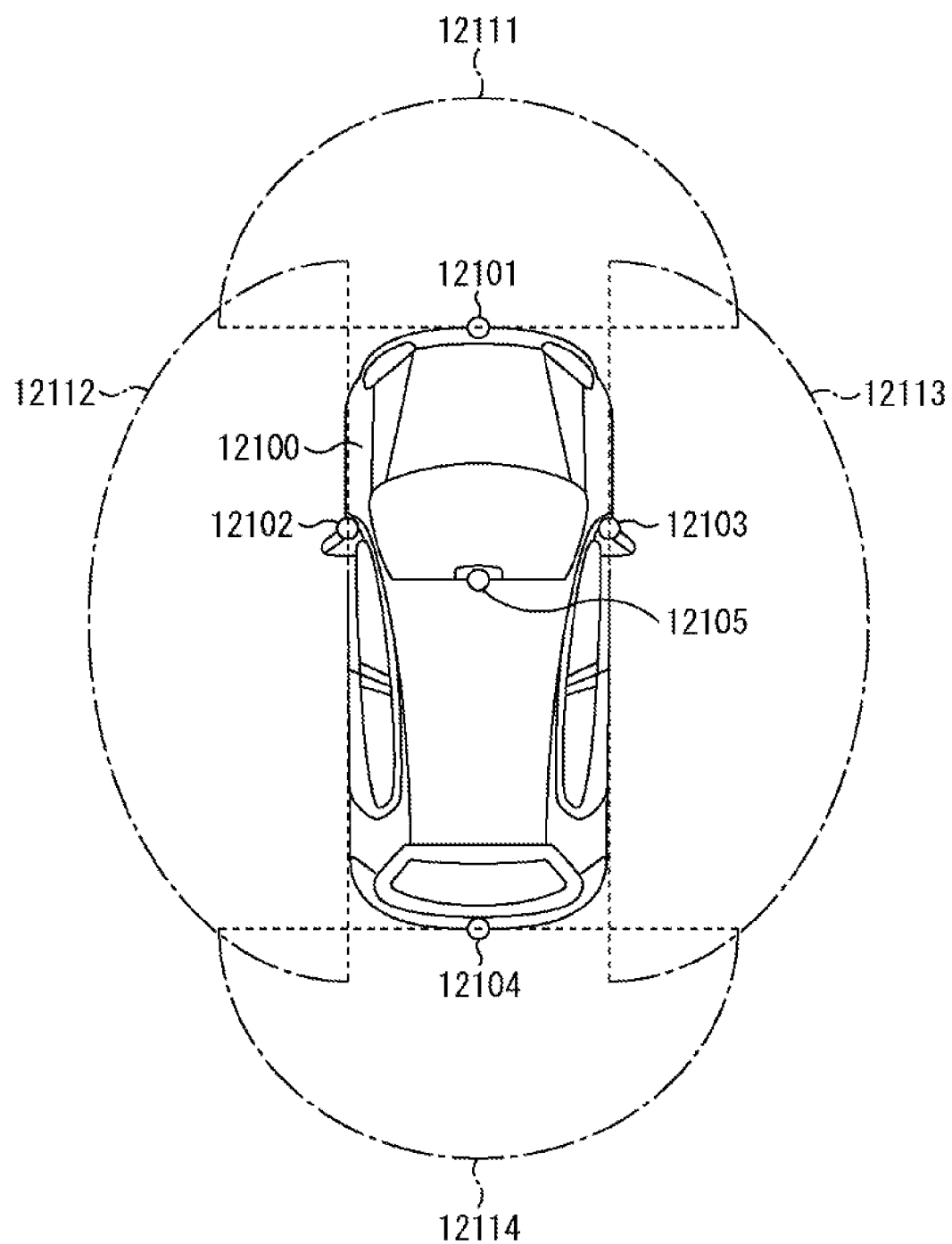
FIG. 31 is a diagram of assistance in explaining an example of installation positions of an outside-vehicle information detecting section and an imaging section.

FIG. 31 is a diagram depicting an example of the installation position of the imaging section 12031.

In FIG. 31, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 31 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given with reference to the first to third embodiments, the modification examples, and the application examples; however, the contents of the present disclosure are not limited to the above-described embodiments, etc., and various modifications are possible.

It is to be noted that the effects described herein are merely exemplary and are not limitative, and may further include other effects.

It is to be noted that the present disclosure may have the following configurations.

(1)

A solid-state imaging device including:

a semiconductor substrate having one surface and another surface opposed to the one surface;

a photoelectric conversion section formed to be embedded in the semiconductor substrate;

a charge holding section provided in the one surface of the semiconductor substrate while being stacked on the photoelectric conversion section;

an n-type semiconductor region provided in the one surface of the semiconductor substrate; and a charge-voltage conversion section provided in the one surface of the semiconductor substrate, in which a charge generated in the photoelectric conversion section is transferred via the n-type semiconductor region to the charge holding section.

(2)

The solid-state imaging device according to (1), in which the semiconductor substrate further includes a first separation film between the photoelectric conversion section and the charge holding section, the first separating film hindering movement of the charge.

(3)

The solid-state imaging device according to (2), in which the n-type semiconductor region and the first separation film are in contact with each other.

(4)

The solid-state imaging device according to (2) or (3), in which
the first separation film extends to the one surface of the semiconductor substrate, and
the charge holding section is surrounded by the first separation film and the n-type semiconductor region.

(5)

The solid-state imaging device according to any one of (1) to (4), in which
the n-type semiconductor region extends to a position between the photoelectric conversion section and the charge holding section, and
the charge holding section is surrounded by the n-type semiconductor region.

(6)

The solid-state imaging device according to any one of (1) to (5), including an overflow gate on the one surface of the semiconductor substrate,
in which the n-type semiconductor region is in contact with the overflow gate.

(7)

The solid-state imaging device according to any one of (1) to (6), including a plurality of pixels each provided with the photoelectric conversion section;
in which the semiconductor substrate further includes a second separation film provided between the plurality of pixels, the second separation film hindering movement of the charge between the plurality of pixels.

(8)

The solid-state imaging device according to (7), in which the second separation film is provided between the one surface and the other surface of the semiconductor substrate.

(9)

The solid-state imaging device according to any one of (2) to (6), including a plurality of pixels each provided with the photoelectric conversion section, in which
the semiconductor substrate further includes a second separation film provided between the plurality of pixels, the second separation film hindering movement of the charge between the plurality of pixels, and
the first separation film and the second separation film are coupled to each other.

(10)

A solid-state imaging device including:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate;
a charge-voltage conversion section provided in the one surface of the semiconductor substrate; and
a first separation film provided between the photoelectric conversion section and the charge holding section,
in which the first separation film overlaps, in a plan view, at least a portion of a gate of a transfer transistor provided between the photoelectric conversion section and the charge holding section.

(11)

An electronic apparatus including a solid-state imaging device, the solid-state imaging device including:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate; and
a charge-voltage conversion section provided in the one surface of the semiconductor substrate,
in which a charge generated in the photoelectric conversion section is transferred via the n-type semiconductor region to the charge holding section.

(12)

An electronic apparatus including a solid-state imaging device, the solid-state imaging device including:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate;
a charge-voltage conversion section provided in the one surface of the semiconductor substrate; and
a first separation film provided between the photoelectric conversion section and the charge holding section,
in which the first separation film overlaps, in a plan view, at least a portion of a gate of a transfer transistor provided between the photoelectric conversion section and the charge holding section.

This application claims priority from Japanese Patent Application No. 2018-152938 filed on Aug. 15, 2018 with the Japan Patent Office, the entire contents of which are incorporated in the present application by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate; and
a charge-voltage conversion section provided in the one surface of the semiconductor substrate,
wherein a charge generated in the photoelectric conversion section is transferred via the n-type semiconductor region to the charge holding section,
wherein the n-type semiconductor region extends to a position between the photoelectric conversion section and the charge holding section, and wherein the charge holding section is surrounded by the n-type semiconductor region.

2. The solid-state imaging device according to claim 1, wherein the semiconductor substrate further includes a first separation film between the photoelectric conversion section and the charge holding section, the first separation film hindering movement of the charge.

3. The solid-state imaging device according to claim 2, wherein the n-type semiconductor region and the first separation film are in contact with each other.

4. The solid-state imaging device according to claim 2, wherein the first separation film extends to the one surface of the semiconductor substrate, and wherein the charge holding section is surrounded by the first separation film and the n-type semiconductor region.

5. The solid-state imaging device according to claim 1, comprising an overflow gate on the one surface of the semiconductor substrate,
wherein the n-type semiconductor region is in contact with the overflow gate.

6. The solid-state imaging device according to claim 1, comprising a plurality of pixels each provided with the photoelectric conversion section;
wherein the semiconductor substrate further includes a second separation film provided between the plurality of pixels, the second separation film hindering movement of the charge between the plurality of pixels.

7. The solid-state imaging device according to claim 6, wherein the second separation film is provided between the one surface and the other surface of the semiconductor substrate.

8. The solid-state imaging device according to claim 2, comprising a plurality of pixels each provided with the photoelectric conversion section, wherein the semiconductor substrate further includes a second separation film provided between the plurality of pixels, the second separation film hindering movement of the charge between the plurality of pixels, and wherein the first separation film and the second separation film are coupled to each other.

9. A solid-state imaging device comprising:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate;
a charge-voltage conversion section provided in the one surface of the semiconductor substrate; and
a first separation film provided between the photoelectric conversion section and the charge holding section,
wherein the first separation film overlaps, in a plan view, at least a portion of a gate of a transfer transistor provided between the photoelectric conversion section and the charge holding section,
wherein the n-type semiconductor region extends to a position between the photoelectric conversion section and the charge holding section, and
wherein the charge holding section is surrounded by the n-type semiconductor region.

10. An electronic apparatus comprising a solid-state imaging device, the solid-state imaging device including:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate; and
a charge-voltage conversion section provided in the one surface of the semiconductor substrate,
wherein a charge generated in the photoelectric conversion section is transferred via the n-type semiconductor region to the charge holding section
wherein the n-type semiconductor region extends to a position between the photoelectric conversion section and the charge holding section, and
wherein the charge holding section is surrounded by the n-type semiconductor region.

11. An electronic apparatus comprising a solid-state imaging device, the solid-state imaging device including:
a semiconductor substrate having one surface and another surface opposed to the one surface;
a photoelectric conversion section formed to be embedded in the semiconductor substrate;
a charge holding section provided in the one surface of the semiconductor substrate while being stacked on the photoelectric conversion section;
an n-type semiconductor region provided in the one surface of the semiconductor substrate;
a charge-voltage conversion section provided in the one surface of the semiconductor substrate; and
a first separation film provided between the photoelectric conversion section and the charge holding section,
wherein the first separation film overlaps, in a plan view, at least a portion of a gate of a transfer transistor provided between the photoelectric conversion section and the charge holding section,
wherein the n-type semiconductor region extends to a position between the photoelectric conversion section and the charge holding section, and
wherein the charge holding section is surrounded by the n-type semiconductor region.

* * * * *